US007535391B1

(12) United States Patent
Newman et al.

(10) Patent No.: US 7,535,391 B1
(45) Date of Patent: May 19, 2009

(54) ANALOG-TO-DIGITAL CONVERTER HAVING RANDOM CAPACITOR ASSIGNMENT AND METHOD THEREOF

(75) Inventors: Bruce M. Newman, Gilbert, AZ (US); Douglas A. Garrity, Gilbert, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 11/969,982

(22) Filed: Jan. 7, 2008

(51) Int. Cl.
H03M 1/20 (2006.01)
(52) U.S. Cl. .................... 341/131; 341/155
(58) Field of Classification Search ............. 341/155, 341/144, 161, 118, 120, 150
See application file for complete search history.

(56) References Cited

U.S. PATENT DOCUMENTS

| | | | |
|---|---|---|---|
| 4,710,724 A | 12/1987 | Connell et al. | |
| 5,574,457 A | 11/1996 | Garrity et al. | |
| 5,625,361 A | 4/1997 | Garrity et al. | |
| 5,644,313 A | 7/1997 | Rakers et al. | |
| 5,680,070 A | 10/1997 | Anderson et al. | |
| 6,195,032 B1 | 2/2001 | Watson et al. | |
| 6,362,770 B1 | 3/2002 | Miller et al. | |
| 6,489,914 B1 | 12/2002 | Jones, III et al. | |
| 6,535,157 B1 | 3/2003 | Garrity et al. | |
| 6,741,194 B1 | 5/2004 | Cassagnes et al. | |
| 6,909,393 B2 | 6/2005 | Atriss et al. | |
| 6,967,611 B2 | 11/2005 | Atriss et al. | |
| 7,002,504 B2 * | 2/2006 | McMahill | 341/161 |
| 7,009,549 B1 | 3/2006 | Corsi | |
| 7,015,852 B1 | 3/2006 | Atris et al. | |
| 7,064,700 B1 | 6/2006 | Garrity et al. | |
| 7,068,202 B2 | 6/2006 | Waltari | |
| 7,095,346 B2 * | 8/2006 | Bogner | 341/120 |
| 7,102,365 B1 | 9/2006 | Atris et al. | |
| 7,233,276 B1 * | 6/2007 | Huang | 341/163 |
| 7,282,929 B2 | 10/2007 | Atris et al. | |
| 7,286,021 B2 * | 10/2007 | Kim | 331/78 |
| 7,289,052 B1 | 10/2007 | Atris et al. | |
| 7,307,572 B2 | 12/2007 | Garrity et al. | |
| 2004/0233092 A1 | 11/2004 | Hong | |
| 2005/0219097 A1 | 10/2005 | Atriss et al. | |
| 2006/0279293 A1 | 12/2006 | Atris et al. | |
| 2006/0284754 A1 | 12/2006 | Garrity et al. | |
| 2007/0247345 A1 | 10/2007 | Atris et al. | |

OTHER PUBLICATIONS

STMicroelectronics; ST10F397 Target Specification; Analog/Digital Converter; pp. 349-352.
Infineon Technologies; TC1796; Analog-to-Digital Converter (ADC0, ADC1); Data Sheets; pp. 55-58 and 71, 81-88; Vo.2, Jan. 2005.
STMicroelectronics; L9119; Knock Sensor Interface;Feb. 26, 1999; pp. 1-23; Rev. 0.3.
Garcia, et al.; Intersil; Measuring Spurious Free Dynamic Range in a D/A Converter; Technical Brief TB326; 1999; pp. 1-2.
Carley, L. Richard; A Noise-Shaping Coder Topology for 15+ Bit Converters; IEEE Journal of Solid-State Circuits, vol. 24, No. 2, Apr. 1989; pp. 267-273.
U.S. Appl. No. 11/674,435, filed Feb. 13, 2007.
Ginetti, Bernard et al., "A CMOS 13-b Cyclic RSD A/D Converter," IEEE Journal of Solid-State Circuits, vol. 27, No. 7, Jul. 1992.

* cited by examiner

Primary Examiner—Brian Young

(57) ABSTRACT

An analog-to-digital converter (ADC) includes a multiplying digital-to-analog converter (MDAC) having a plurality of capacitors and a plurality of capacitor positions. The ADC generates a random number for a conversion cycle. The ADC configures each capacitor of the plurality of capacitors in a corresponding capacitor position of the plurality of capacitor positions based on the random number for the conversion cycle. The ADC converts, for the conversion cycle, a voltage of an analog signal to a digital value based on the capacitor configurations.

20 Claims, 12 Drawing Sheets

US 7,535,391 B1

ANALOG-TO-DIGITAL CONVERTER HAVING RANDOM CAPACITOR ASSIGNMENT AND METHOD THEREOF

FIELD OF THE DISCLOSURE

The present disclosure relates generally to analog-to-digital conversion and more particularly to analog-to-digital conversion utilizing a multiplying digital-to-analog converter (MDAC).

BACKGROUND

Mixed analog and digital systems utilize analog-to-digital converters (ADCs) to convert the voltages of analog signals to corresponding digital values for use by digital components. Redundant signed bit (RSD) and other cyclic or pipelined ADCs often find particular benefit in certain types of systems, particularly where power and space are at a premium. These ADCs typically convert an analog signal to a corresponding digital value through a series of sample and amplify phases. During the initial phase, the voltage of the input analog signal is compared to two or more reference voltages and the results of these comparisons are provided as code bits for the initial stage. An analog component comprising a multiplying digital-to-analog converter (MDAC) is used to determine a residue voltage, and for a second phase the process of comparisons with the reference voltages is repeated with the residue voltage to generate code bits for a third phase. The process of calculating the residue voltage from the residue voltage of the previous stage and comparing the resulting residue voltage to generate code bits can be repeated for a number of phases until the appropriate resolution is reached. An alignment, synchronization, and correction process then is applied to the code values from each stage to generate a digital value representative of the analog signal.

In conventional ADCs each capacitor of the MDAC is reconnected to the amplifier of the MDAC for successive phases such that the same capacitor is connected in the same configuration within the MDAC for the same phase of a conversion cycle. Due to capacitor mismatches in this fixed capacitor configuration and the finite gain of the amplifier, a conventional ADC can experience large steps in the integral non-linearity (INL) at comparator trip points. This non-linearity can introduce significant spurious harmonics, thereby reducing the spurious free dynamic range (SFDR) of the ADC. One approach to improve the dynamic range of an ADC is to reduce capacitor mismatch by implementing larger capacitors that can be more precisely matched. However, larger capacitors require a greater area and consume more power and their use therefore is contrary to goals of reduced power consumption and size. An improved technique for reducing the effects of capacitor mismatch in ADCs without necessitating the use of larger capacitors therefore would be advantageous.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
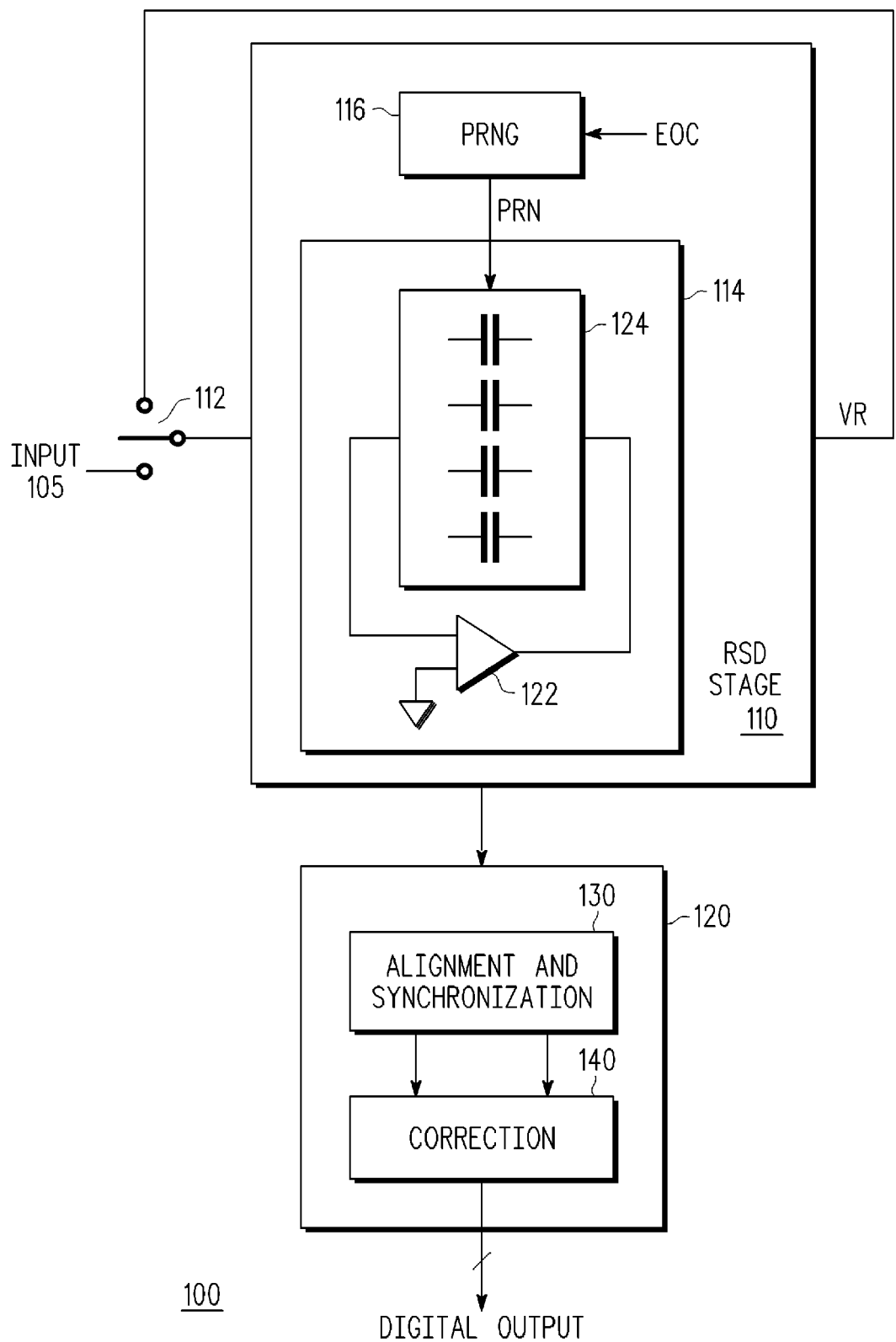
FIG. 1 is a diagram illustrating a cyclic analog-to-digital converter (ADC) having a multiplying digital-to-analog converter (MDAC) with random capacitor assignment in accordance with at least one embodiment of the present disclosure.

FIGS. 1-17 illustrate example techniques for conversion of analog signals to corresponding digital values using an analog-to-digital converter (ADC) employing a multiplying digital-to-analog converter (MDAC). For each conversion cycle, the ADC employs a series of phases to convert an input voltage of an analog signal to its corresponding digital value based on the generation of residual voltages using the MDAC and comparisons of the resulting residual voltages to two or more reference voltages. In at least one embodiment, at the start of a conversion cycle the capacitors of the MDAC can be randomly assigned to corresponding capacitor positions for the duration of the conversion cycle. The capacitors then are sequentially connected in various sample and gain configurations with respect to an amplifier of the MDAC as the phases of the conversion cycle progress. In at least one embodiment, the particular connection of a capacitor within a configuration of a phase depends on the capacitor position to which the capacitor is randomly assigned at the start of the conversion cycle. At the start of the next conversion cycle, the capacitors can be randomly reassigned again for the duration of the next conversion cycle. By randomly assigning capacitors to corresponding capacitor positions between conversion cycles, a non-linearity introduced by capacitor mismatch can be more evenly distributed over the input voltage range of the ADC. This non-linearity distribution permits the use of smaller capacitors for a given usable bandwidth, or an improved usable bandwidth for a given capacitor size.

The term "capacitor," as used herein, refers to one or more capacitive elements configured to, or configurable to, provide a particular capacitance. To illustrate, a capacitor can be implemented as a single capacitive element that provides the particular capacitance, or as a network of capacitive elements connected in parallel, in series, or a combination thereof, to provide the particular capacitance. A capacitor can be implemented as an integrated capacitor (e.g., one or more capacitive structures implemented at one or more layers of an integrated circuit) or as a discrete capacitor.

The term "capacitor position," as used herein, refers to a pair of nodes within a circuit to which a corresponding pair of electrodes of any one of a plurality of capacitors can be selectively coupled using switches, logic, or a combination thereof.

The term "conversion cycle," as used herein, refers to a series of phases of operation of an ADC used to convert a voltage of an analog signal to a corresponding digital value. The phases of a conversion cycle can be implemented as, for example, phases of cycles of a clock signal.

The term "random" (and its variants), as used herein, refers to either fully-random or pseudo-random. For clarity purposes, the techniques of the present disclosure are described in a pseudo-random context. Using the guidelines provided herein, these techniques can be implemented in a fully-random context without departing from the scope of the present disclosure.

For ease of illustration, the techniques disclosed herein are described in the example context of an example redundant signed digit (RSD) implementation whereby a single RSD stage is used to recursively pass through a sequence of sample and gain phases such that the residue voltage output from the RSD stage for one sample stage is used in calculating the next residue voltage during the next sample stage. An example of a cyclic single-stage RSD implementation is described in U.S. patent application Ser. No. 11/674,435, the entirety of which is incorporated by reference herein. In other embodiments, the disclosed techniques can be adapted for use in an RSD implementation having a sequence of two or more RSD stages, where the residue voltage output by one RSD stage is input to the next RSD stage. An example of a multiple-stage RSD implementation is described in U.S. Pat. No. 5,664,313, the entirety of which is incorporated by reference herein.

For ease of illustration, the techniques of the present disclosure are described in an example context of a cyclic ADC, such as a single-stage cyclic ADC or a multiple-stage cyclic ADC. However, these techniques also may be implemented in pipelined ADCs comprising a pipeline of analog stages without departing from the scope of the present disclosure. Further, although FIGS. 1-17 illustrate example single-ended implementations for ease of discussion, those skilled in the art can adapt the illustrated techniques for use in differential signaling applications using the guidelines provided herein without departing from the scope of the present disclosure.

FIG. 1 is a block diagram illustrating a cyclic RSD ADC 100 having random capacitor assignment in accordance with at least one embodiment of the present disclosure. The RSD ADC 100 includes an RSD stage 110 and a digital section 120. The RSD stage 110 includes a multiplying digital-to-analog converter (MDAC) 114 and a pseudo-random number generator (PRNG) 116. The PRNG 116 can include any of a variety of PRNGs, such as a linear feedback shift register. The PRNG 116 generates a pseudo-random number (PRN) in response to the assertion of an end-of-cycle (EOC) signal, which, as discussed below, can be asserted at the end of a conversion cycle of the RSD ADC 100 or prior to the start of the next conversion cycle. The MDAC 114 includes an amplifier 122 and a capacitor set 124 comprising a plurality of capacitors.

Each capacitor of the capacitor set 124 is selectively coupleable to a corresponding capacitor position with respect to the amplifier 122 based on the PRN output by the PRNG 116. For each successive phase of a given conversion cycle, the capacitors of the capacitor set 124 are reconnected in a corresponding capacitor configuration. To illustrate, for an initial sample configuration, some or all of the capacitors can be configured so as to sample a voltage of an input analog signal, and for an initial gain configuration, the capacitors used in the initial sample configuration can be reconfigured into a gain configuration so as to multiply the sampled voltage by a predetermined multiplier. For subsequent phases, a subset of the capacitors can be configured to implement a gain configuration so as to generate a residue voltage VR via the amplifier 122 for the next phase and another subset of the capacitors can be configured to implement a sample configuration at the output of the amplifier so as to sample and hold the residue voltage VR for the next phase. Typically, for these latter phases the capacitors configured in the sample configuration for one phase are reconfigured into the gain configuration for the next phase, and vice versa. Thus, the series of phases of a conversion cycle results in a series of sample and gain configurations using the capacitors of the capacitor set 124. In at least one embodiment, the particular connection of a capacitor for any given phase of a conversion cycle depends on the capacitor position to which the capacitor was randomly assigned at the start of the conversion cycle.

The digital section 120 has an alignment and synchronization block 130 and a correction block 140. An analog input signal (e.g., a voltage) is presented to an input terminal 105 of the RSD stage 110 via a first switch 112. The RSD stage 110 provides a digital output signal to the digital section 120. The RSD stage 110 also generates a residual voltage VR, which is fed back to the input of the RSD stage 110 by way of the first switch 112. The first switch 112 is closed (connecting the input to the RSD stage 110) for the initial phase of a conversion cycle, in which the analog input signal is received, and then opened (connecting the output of the RSD stage 110 to the input of the RSD stage 110) for the remaining phases of the conversion cycle. The number of phases to complete an A/D conversion of the analog input signal to a digital output signal depends on the resolution (number of bits) in the digital output signal. The digital bits output from the RSD stage 110 are provided to the digital section 120, where they are aligned, synchronized, and combined to provide a standard format binary output code.

As described in greater detail below with reference to FIGS. 6-17, the RSD stage 110, in one embodiment, comprises a single multi-bit/single-bit RSD stage that is initially configured to have a resolution of at least 2.5 bits during a first phase of the conversion cycle, then reconfigured to have a resolution of 2.5 bits during subsequent phases of the conversion cycle.

Figure 2:
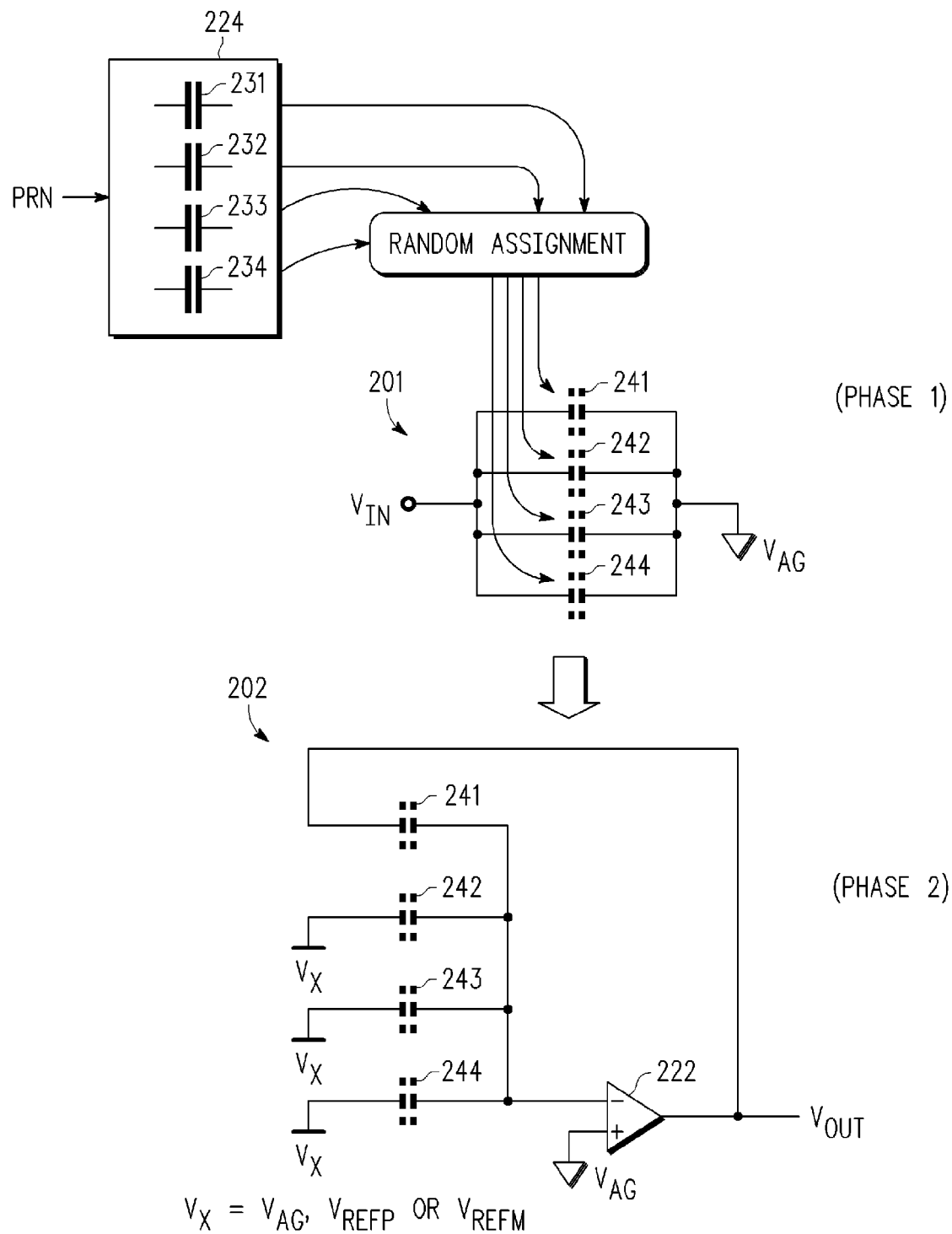
FIG. 2 is a diagram illustrating a random assignment of capacitors within the MDAC of the cyclic ADC of FIG. 1 in accordance with at least one embodiment of the present disclosure.

FIG. 2 illustrates an example random assignment of capacitors to corresponding capacitor positions of a MDAC 214 (corresponding to the MDAC 114 of FIG. 1) in accordance with at least one embodiment of the present disclosure. Although FIG. 2 illustrates example capacitor positions for the two initial phases of a particular conversion cycle sequence of the MDAC 214, a more complete sequence of capacitor configurations based on assigned capacitor positions is illustrated below with reference to FIGS. 6-17.

The MDAC 214 includes an amplifier 222 (corresponding to the amplifier 122 of FIG. 1) and a capacitor network 224 (corresponding to the capacitor network 124 of FIG. 1), whereby the capacitor network 224 includes four capacitors, capacitors 231-234, each initially assignable to a random one of four capacitor positions 241-244 based on received pseudo-random number (PRN).

The example of FIG. 2 depicts two capacitor configurations 201 and 202 corresponding to two successive phases (phase 1 and phase 2) of a conversion cycle. The capacitor configuration 201 represents an initial sample configuration by which all four of the capacitors 231-234 are used to sample the voltage ($V_{IN}$) of the input analog signal, which is discussed in greater detail herein with reference to FIG. 9. The capacitor configuration 202 represents an initial gain configuration by which all four of the capacitors 231-234, having sampled $V_{IN}$, are used to multiply the voltage $V_{IN}$ to generate a voltage $V_{OUT}$. The capacitor configuration 202 is discussed in greater detail herein with reference to FIG. 10. For the phases of the conversion cycle following phase 2, the capacitors 231-234 can be reconfigured with respect to the amplifier in the sequence illustrated herein with reference to FIGS. 11-17.

In the capacitor configuration 201, a capacitor assigned to the capacitor position 241 would have a first electrode coupled to receive the input voltage $V_{IN}$ of the input analog signal and a second electrode coupled to analog ground ($V_{AG}$). A capacitor assigned to the capacitor position 242 would have a first electrode coupled to receive the voltage $V_{IN}$ and a second electrode coupled to $V_{AG}$. A capacitor assigned to the capacitor position 243 also would have a first electrode coupled to receive the voltage $V_{IN}$ and a second electrode coupled to $V_{AG}$. Likewise, a capacitor assigned to the capacitor position 242 would have a first electrode coupled to receive the voltage $V_{IN}$ and a second electrode coupled to $V_{AG}$.

In the capacitor configuration 202, a capacitor assigned to the capacitor position 242 would have the first electrode coupled to a voltage $V_X$ and the second electrode coupled to the negative input of the amplifier 222. Depending on the particular phase of a conversion cycle, the voltage $V_X$ represents a reference voltage (e.g., $V_{REFP}$ or $V_{REFM}$), or the analog ground ($V_{AG}$). The capacitors assigned to the capacitor positions 243 and 244, respectively, would be similarly configured. The capacitor assigned to the capacitor position 241 would have the first electrode coupled to the output of the amplifier 222 and the second electrode coupled to negative input of the amplifier 222. After this gain configuration, the capacitors 231-234 can be reconfigured for sequential phases depending on random capacitor position assignment as described below with reference to FIGS. 11-17.

As illustrated by capacitor configurations 201 and 202, in one embodiment the capacitors 231-234 are reconfigured in a fixed sequence based on the capacitor positions to which they are randomly assigned starting with an initial sample configuration using all four capacitors 231-234 followed by the initial gain configuration using all four capacitors 231-234. Thus, because the connections of a particular capacitor within a series of configurations over a conversion cycle is based on the capacitor position to which the capacitor is connected, the random assignment of capacitors to corresponding capacitor positions can distribute the non-linearity introduced by a capacitor mismatch over the entire range of an ADC. Simulations have demonstrated the random assignment of capacitors to distribute a non-linearity due to capacitor mismatch can result in an improvement of up to thirty decibels (dB) in the SFDR in the implementation represented by FIGS. 9-16 described below.

Figure 3:
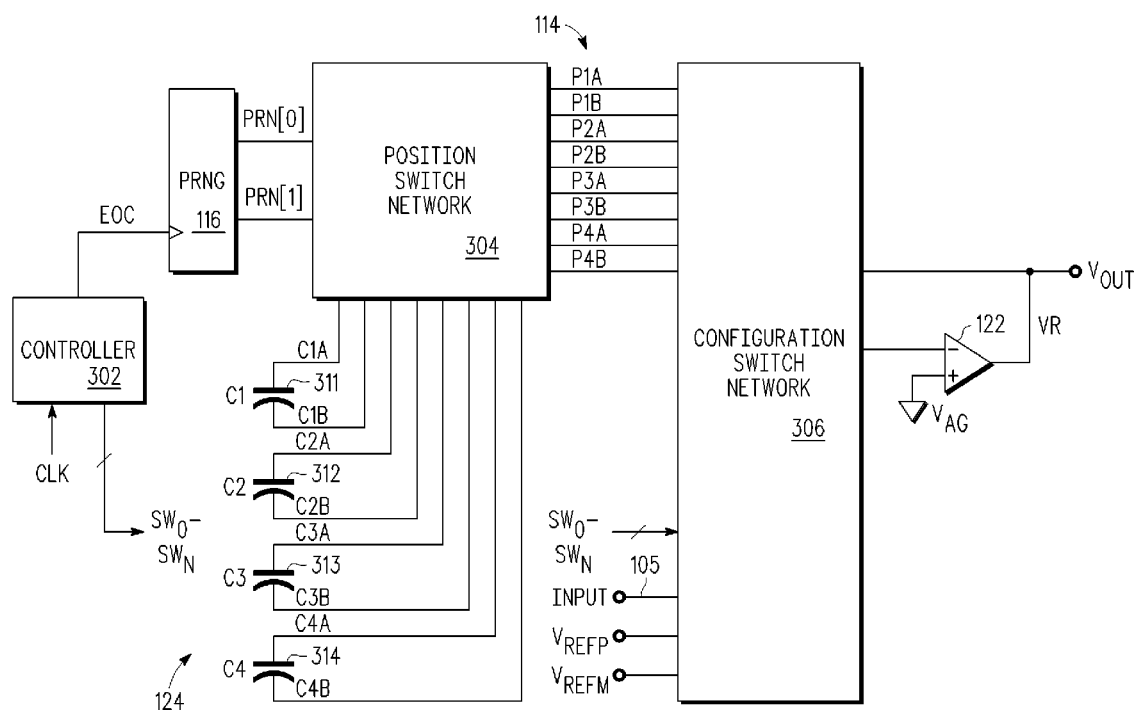
FIG. 3 is diagram illustrating an example implementation of the MDAC of the cyclic ADC of FIG. 1 in accordance with at least one embodiment of the present disclosure.

FIG. 3 illustrates an example implementation of the RSD stage 110 of FIG. 1 in accordance with at least one embodiment of the present disclosure. The RSD stage 110 includes the MDAC 114 and the PRNG 116. The MDAC 114 comprises the amplifier 122, the capacitor network 124, a controller 302, a position switch network 304, and a configuration switch network 306.

The controller 302 includes an input configured to receive a clock (CLK) signal, an output to provide the EOC signal, and an output to provide a plurality of switch signals (SW0-SWn). In at least one embodiment, the controller 302 utilizes the clock signal to control the timing of phases of conversion cycles and to control the timing between conversion cycles. In response to the initiation of a conversion cycle (or in response to the end of a previous conversion cycle), the controller 302 is configured to assert the EOC signal, thereby directing the PRNG 116 to generate a PRN. As each phase of a conversion cycle initiates, the controller 302 configures the switch signals SW0-SWn according to the phase so as to direct the configuration switch network 306 to configure the capacitors of the capacitor network 124 into a capacitor configuration associated with the current phase as discussed in greater detail below.

The capacitor network 124, in the illustrated example, comprises capacitors 311-314 (also referred to as capacitors C1-C4, respectively). The capacitor 311 (C1) has a electrode pair, C1A and C1B, coupled to the position switch network 304, the capacitor 312 (C2) has a electrode pair, C2A and C2B, coupled to the position switch network 304, capacitor 313 (C3) has a electrode pair, C3A and C3B, coupled to the position switch network 304, and the capacitor 314 (C4)

has a electrode pair, C4A and C4B, coupled to the position switch network 304. The positive input of the amplifier 122 is connected to the analog ground voltage reference $V_{AG}$ in the embodiment of FIG. 3.

The position switch network 304 includes an input to receive the bits of the PRN output by the PRNG 116 in response to the assertion of the EOC signal prior to the start of a conversion cycle. In the illustrated example, there are four capacitors and four capacitor positions and thus the PRN is a two bit number (PRN[1] and PRN[0]). The position switch network 304 further has four output lead pairs (P1A and P1B, P2A and P2B, P3A and P3B, P4A and P4B) coupled to the configuration switch network 306. In at least one embodiment, the position switch network 304 comprises switches and other logic configured to decode the PRN so as to randomly couple each of the electrode pairs of the capacitors 311-314 to a corresponding output lead pair for the duration of the conversion cycle. A particular implementation of the position switch network 304 is described herein with reference to FIG. 4.

The switch configuration network 306 includes input lead pairs coupled to the output lead pairs of the position switch network 304. The switch configuration network 306 further includes inputs to receive the analog input signal, the residue voltage VR output by the amplifier 122, and various reference voltages (e.g., $V_{REFP}$ and $V_{REFM}$). The configuration switch network 306, in one embodiment, comprises switches (e.g., transistors) and other logic to couple each of the output lead pairs from the position switch network 304 to a corresponding capacitor position for the course of a conversion cycle using state switch signals SW0-SWn and further to couple the input analog signal, the reference voltages, and the residue voltage VR to the capacitors in the corresponding capacitor positions based on the switch signals SW0-SWn. However, unlike the position switch network 304 which randomly couples the capacitors 311-314 to the output lead pairs, the configuration switch network 306 progresses the capacitor coupled to a particular capacitor position through a set sequence of capacitor configurations with respect to the amplifier 122, such as those illustrated in FIGS. 2 and 9-17. To illustrate, in one embodiment, the capacitor position associated with the output lead pair P1A and P1B is the capacitor position 241 (FIG. 2), the capacitor position associated with the output lead pair P2A and P2B is the capacitor position 243 (FIG. 2), the capacitor position associated with the output lead pair P3A and P3B is the capacitor position 242 (FIG. 2), and the capacitor position associated with the output lead pair P4A and P4B is the capacitor position 244 (FIG. 2). It will be appreciated that the particular capacitor positions and sequence of capacitor configurations are implementation-specific. For illustrative purposes, a particular implementation of the configuration switch network 306 for an example multiple-bit RSD stage is illustrated below with reference to FIG. 7.

Figure 4:
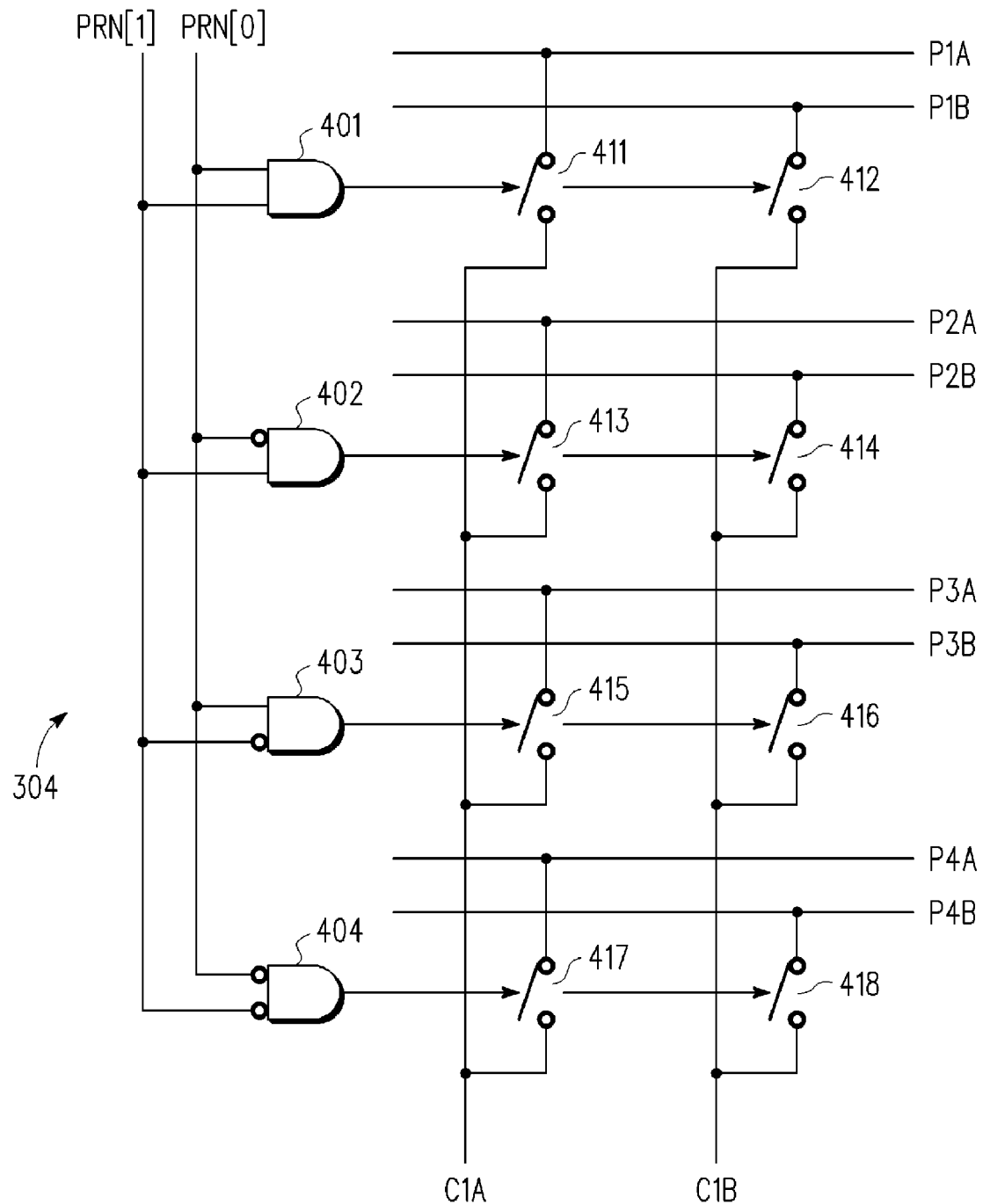
FIG. 4 is a schematic diagram illustrating an example implementation of a position switch network of the MDAC of FIG. 3 in accordance with at least one embodiment of the present disclosure.

FIG. 4 illustrates a particular implementation of the position switch network 304 in accordance with at least one embodiment of the present disclosure. For ease of illustration, only the circuitry for connecting the electrode pair, C1A and C1B, of the capacitor 311 to a select one of the output lead pairs (P1A and P1B, P2A and P2B, P3A and P3B, P4A and P4B) based on the two bits of the PRN value (PRN[0] and PRN[1]). Similar circuitry can be utilized to randomly connect the electrode pairs of the capacitors 312-314 to the output lead pairs (with the appropriate modification described below).

As depicted, the position switch network 304 includes four AND gates 401-404. The AND gate 401 includes inputs to receive the PRN[0] and PRN[1] bits. The AND gate 402 includes inputs to receive the PRN[1] bit and the inverted representation of the PRN[0] bit. The AND gate 403 includes inputs to receive the PRN[0] bit and the inverted representation of the PRN[1] bit. The AND gate 404 includes inputs to receive the inverted representations of the PRN[0] and PRN [1] bits. The position switch network 304 further includes switches 411-418 (e.g., transistors), whereby each switch is configured so as to be open (non-conductive) when its switch input is negated (unasserted) and closed (conductive) when its switch input is asserted. The switches 411 and 412 are configured to couple the output leads P1A and P1B to the electrodes C1A and C1B, respectively, based on the output of the AND gate 401. The switches 413 and 414 are configured to couple the output leads P2A and P2B to the electrodes C1A and C1B, respectively, based on the output of the AND gate 402. The switches 415 and 416 are configured to couple the output leads P3A and P3B to the electrodes C1A and C1B, respectively, based on the output of the AND gate 403. The switches 417 and 418 are configured to couple the output leads P4A and P4B to the electrodes C1A and C1B, respectively, based on the output of the AND gate 404.

As the AND gates 401-404 are configured, the output of only one AND gate is asserted for any given combination of the PRN[0] and PRN[1] bits. Accordingly, in the illustrated configuration, only one of the output lead pairs is connected to the electrode pair of the capacitor 311 for any given combination of the PRN[0] and PRN[1] bits. This same general configuration can be used to permit random assignment of the capacitors 312-314 (FIG. 3) to the output lead pairs, with the exception that the inputs to the AND gate will need to be rearranged in a different manner for each capacitor so that the electrodes of only one capacitor are coupled to one output lead pair for any given bit combination.

Figure 5:
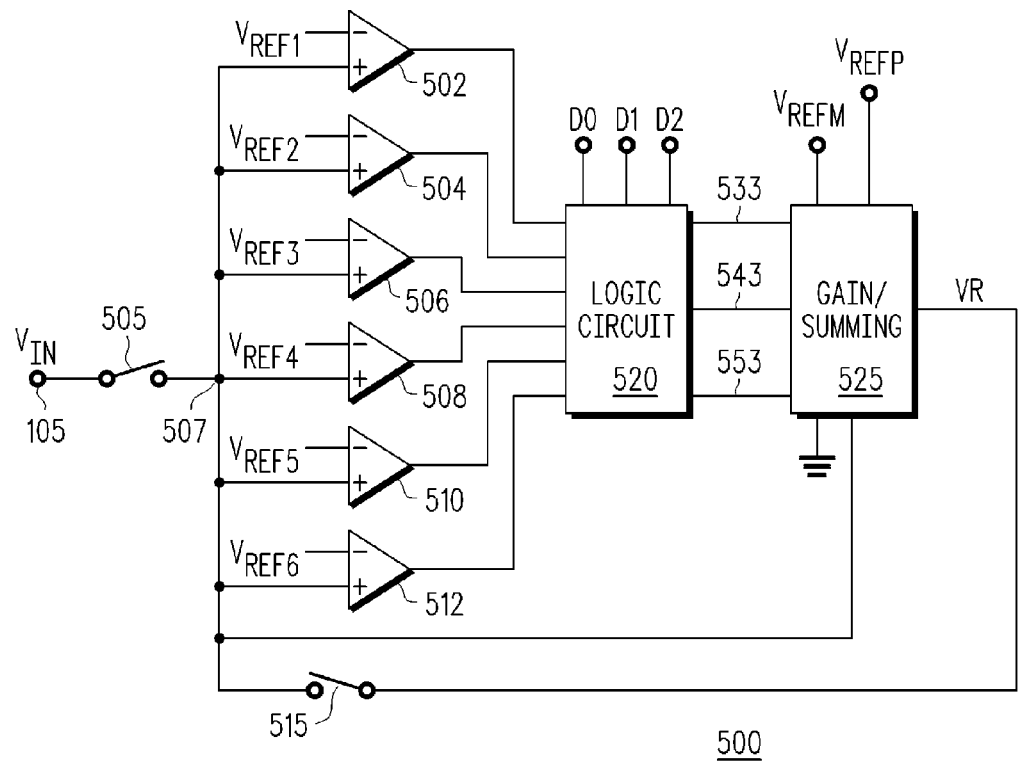
FIG. 5 is a block diagram of an example single multi-bit/single-bit redundant signed digit (RSD) implementation of the cyclic stage of FIG. 1 in accordance with at least one embodiment of the present disclosure.
Figure 6:
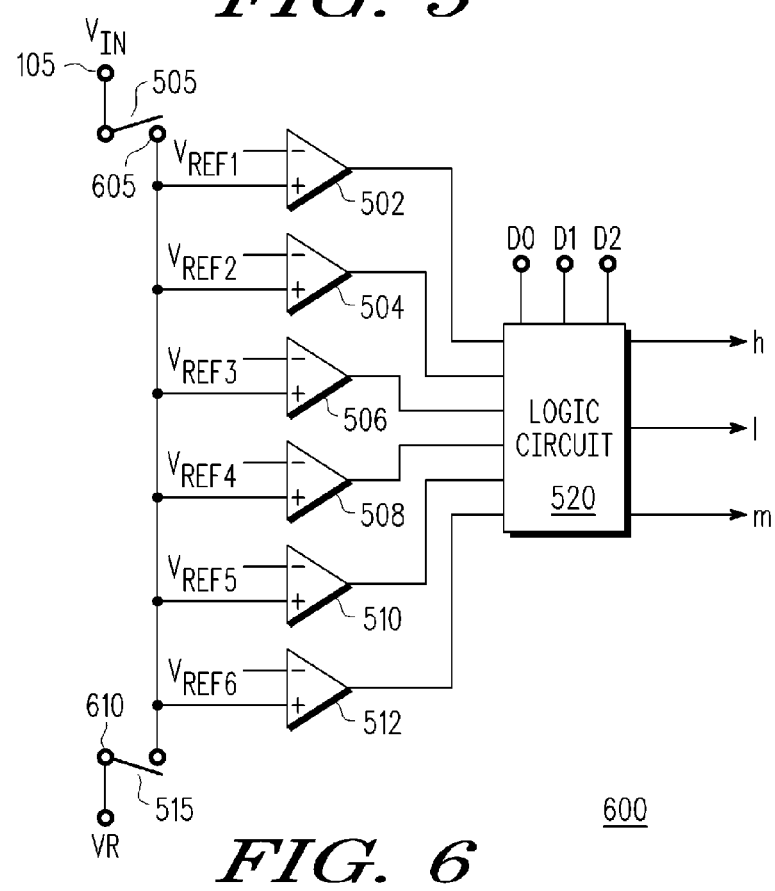
FIG. 6 is a circuit diagram illustrating an example sub-ADC of the single multi-bit/single-bit RSD implementation of FIG. 5 in accordance with at least one embodiment of the present disclosure.
Figure 7:
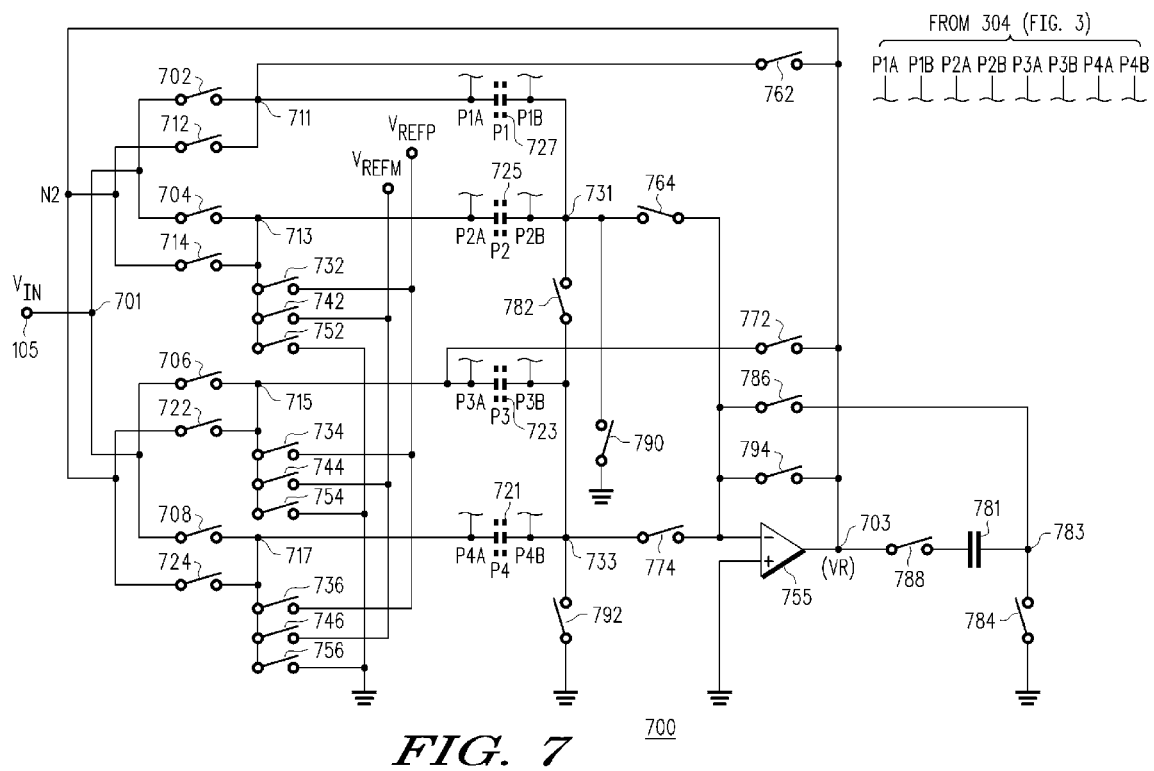
FIG. 7 is a schematic circuit diagram illustrating an example multiply digital-to-analog converter (MDAC) of the single multi-bit/single-bit RSD implementation of FIG. 5 in accordance with at least one embodiment of the present disclosure.

FIGS. 5-7 illustrate a particular implementation of the cyclic ADC 100 of FIG. 1 utilizing a single multi-bit/single-bit RSD stage having a 10-bit resolution as described in the aforementioned U.S. patent application Ser. No. 11/674,435. Although the example techniques for random assignment of capacitors in a cyclic ADC of the present disclosure are described in the following context, these techniques are not limited to the following context but instead can be implemented in any of a variety of cyclic or pipelined ADCs without departing from the scope of the present disclosure.

FIG. 5 illustrates an example single multi-bit/single-bit RSD stage 500 corresponding to the RSD stage 100 of FIG. 1. The RSD stage 500 includes the input terminal 105 at which the analog input signal (VIN) is applied and a first switch 505 to selectively apply the analog input signal (VIN) to the node 507. The RSD stage 500 also includes a feedback switch 515 that is used to selectively apply a residual voltage VR (VR) to the node 507.

The RSD stage 500 further includes a first, second, third, fourth, fifth, and sixth comparators 502, 504, 506, 508, 510, and 512, respectively. Because the RSD stage 500 has six comparators, it can achieve a maximum resolution of 1.5 bits. Although FIG. 5 illustrates the six comparator configuration, alternative embodiments may have more than six comparators. In other words, alternative embodiments may achieve resolutions that are greater than 1.5 bits. Each of the comparators 502, 504, 506, 508, 510, and 512 has a positive input terminal that is connected to the node 507. Depending on the state of the first switch 505 and the feedback switch 515, the positive input terminals of the comparators 502, 504, 506, 508, 510, and 512 receive either the analog input signal or the residual voltage VR. That is, a selected one of the analog input signal and the residual voltage VR is input to the positive input terminals of the first through sixth comparators 502,

504, 506, 508, 510, and 512 through the use of the switches 505 and 515. In one embodiment, the residual voltage VR is provided to the comparators 502, 504, 506, 508, 510, and 512 via a direct feedback signal path as shown in FIG. 5 (i.e., no intervening circuitry, such as a sample and hold circuit).

Each of the comparators 502, 504, 506, 508, 510, 512 also has a negative input terminal that receives a first, second, third, fourth, fifth, and sixth predetermined voltage signals, respectively (e.g., VREF1, VREF2, VREF3, VREF4, VREF5, and VREF6). Each of the first, second, third, fourth, fifth, and sixth comparators 502, 504, 506, 508, 510, and 512 compare the signals applied to their respective input terminals to generate a comparator output signal.

In one embodiment, the RSD stage 500 is configurable such that, during a conversion cycle for an analog input signal that occurs over a number of sequential phases, the values of the predetermined voltage signals (VREF1, VREF2, VREF3, VREF4, VREF5, and VREF6) may be selectively changed for each one of the phases. For example, during a first phase of the conversion cycle, each of the first, second, third, fourth, fifth, and sixth predetermined voltage signals (VREF1, VREF2, VREF3, VREF4, VREF5, and VREF6) may each be set to a unique value. During second and subsequent phases of the conversion cycle, some or all of the first, second, third, fourth, fifth, and sixth predetermined voltage signals (VREF1, VREF2, VREF3, VREF4, VREF5, and VREF6) may be changed to have a different value then in a previous phase.

According to the example embodiment, during phases of the conversion cycle after the first phase, the RSD stage 500 uses outputs from less than all of the comparators 502, 504, 506, 508, 510, and 512. Thus, for phases after the first phase, the resolution that is achieved from the single-bit/multi-bit RSD stage 500 is reduced relative to the resolution of the first phase. These aspects of the example embodiment are described in greater detail below.

The outputs of the first, second, third, fourth, fifth, and sixth comparators 502, 504, 506, 508, 510, and 512 are connected to a logic circuit 520. During phases of a conversion cycle, the logic circuit 520 is capable of generating a digital output signal that is representative of the selected one of either the analog input signal or the residual voltage VR. In an example embodiment, the logic circuit 520 generates three raw digital bits (D0, D1, D2) as the digital output signal during a phase of a conversion cycle based upon the output from all the comparators 502, 504, 506, 508, 510, 512. In the example embodiment, the logic circuit 520 generates two raw digital bits (D0, D1) as the digital output signal during another phase of the conversion cycle based upon outputs from less than all of the comparators 502, 504, 506, 508, 510, 512. In a preferred embodiment, the three digital bits (D0, D1, D2) are generated during the first phase of the conversion cycle. The digital bits generated during any phase of the conversion cycle are aligned and synchronized in the digital section 120, and then combined with the digital bit or bits from other phases of the conversion cycle to form a formatted binary output code.

During phases of the conversion cycle, the logic circuit 520 is also capable of generating a high switch control signal 533, a mid switch control signal 553, and a low switch control signal 543 based upon at least two of the output signals from the comparators 502, 504, 506, 508, 510, and 512.

The single-bit/multi-bit RSD stage 500 additionally includes a programmable gain/summing element 525. The programmable gain/summing element 525 receives as inputs the high switch control signal 533, the mid switch control signal 553, the low switch control signal 543, the selected one of the analog input signal and the residual voltage VR from node 507, a first reference voltage VREFP, a second reference voltage VREFM, and a ground voltage. The programmable gain/summing element 525 (corresponding to the MDAC 114, FIG. 1) generates the residual voltage VR. The residual voltage VR may be thought of as a sum of two products. Depending on the particular phase of the conversion cycle, the first product is either the analog input signal or a previously generated value of the residual voltage VR, multiplied by a first gain factor. The second product is a selected one of the reference voltages (VREFP, VREFM, or zero), multiplied by a second gain factor.

The feedback switch 515 is provided for selecting the residual voltage VR as an input to the programmable gain/summing element 525 and the comparators 502, 504, 506, 508, 510, and 512. The feedback switch 515 is disposed between the output of the programmable gain/summing element 525 and the node 507. When the feedback switch 515 is closed, the first switch 505 is open so that the residual voltage VR is input to the programmable gain/summing element 525 and the comparators 502, 504, 506, 508, 510, and 512. When the first switch 505 is closed, the feedback switch 515 is open so that the analog input signal is input to the programmable gain/summing element 525 and the comparators 502, 504, 506, 508, 510, and 512. As discussed above, the first switch 505 is closed in a first clock cycle during the conversion of the analog input signal and the first switch 505 is open for subsequent cycles of converting the analog input signal.

FIGS. 6 and 7 illustrate in further detail the multi-bit/single-bit RSD stage 500 of FIG. 5 in accordance with at least one embodiment of the present disclosure. FIG. 6 illustrates a sub-ADC 600 in accordance with an example embodiment, while FIG. 7 illustrates a multiplying digital-to-analog converter (MDAC) 700 in accordance with an example embodiment. The multi-bit/single-bit RSD stage 500 illustrated in FIG. 5 may be implemented with the sub-ADC 600 of FIG. 6 and the MDAC 700 of FIG. 7.

Referring to FIG. 6, the sub-ADC 600 includes the input terminal 105 that receives an analog input signal (VIN). The first switch 505 is disposed between the input terminal 105 and a first node 605. The first switch 505 is operable to selectively apply the analog input signal to the first node 605 when the first switch is closed. The feedback switch 515 is disposed between the first node 605 and a second node 610. The feedback switch 515 is operable to selectively apply the residual voltage VR to the first node 605 when the feedback switch 515 is closed. As was discussed above, when the first switch 505 is closed, the feedback switch 515 is open and when the first switch 505 is open, the feedback switch 515 is closed. The first switch 505 is closed during the first phase of a conversion cycle and the feedback switch 515 is closed during subsequent phases of the conversion cycle.

The sub-ADC 600 further includes first, second, third, fourth, fifth, and sixth comparators 502, 504, 506, 508, 510, and 512, respectively. The operation of the comparators 502, 504, 506, 508, 510, 512 is the same as what was described above for FIG. 5. The sub-ADC 600 further includes the logic circuit 520. The logic circuit 520 is connected to the first through sixth comparators 502, 504, 506, 508, 510, 512 and receives the output signals from the first through sixth comparators.

In one embodiment, during the first phase of a conversion cycle, the logic circuit 520 generates three raw digital bits (D0, D1, D2) based upon the output signals from each of the first through sixth comparators 502, 504, 506, 508, 510, 512. According to the example embodiment, the logic circuit 520 generates two raw digital bits (D0, D1) during one or more subsequent phases of the conversion cycle, based upon the output signals from less than all of the comparators 502, 504, 506, 508, 510, 512. The logic circuit also generates control signals (h, l, m), which are used to control some switches of the MDAC 700. This will be explained in further detail below. The control signals h, l, m correspond to the high, low, and mid switch control signals 533, 543, and 553 of FIG. 5, respectively.

Referring to FIG. 7, an implementation of the MDAC 700 utilizing the random assignment of capacitors to initial capacitor positions is illustrated in accordance with one embodiment of the present disclosure. In the illustrated example, the MDAC 700 represents a particular implementation of the MDAC 114 of FIG. 3. The MDAC 700 includes an operational amplifier (op-amp) 755 (corresponding to the amplifier 122, FIG. 1) and the configuration switch network 306, which in FIG. 7 comprises a capacitor 781, capacitor positions 721, 723, 725, 727, and switches 702, 704, 706, 708, 712, 714, 722, 724, 732, 734, 736, 742, 744, 746, 752, 754, 756, 762, 764, 772, 774, 782, 784, 786, 788, 790, 792, and 794, all of which are arranged in the manner shown in FIG. 7.

In the illustrated example, the capacitor position 721 is coupled to a randomly selected one of the capacitors 321-324 (FIG. 3) via the output lead pair P4A and P4B of the position switch network 306 (FIG. 3). The capacitor position 725 is coupled to another randomly selected one of the capacitors 321-324 via the output lead pair P3A and P3B of the position switch network 306. The capacitor position 723 is coupled to another randomly selected one of the capacitors 321-324 via the output lead pair P2A and P2B of the position switch network 306. The capacitor position 721 is coupled to another randomly selected one of the capacitors 321-324 via the output lead pair P1A and P1B of the position switch network 306.

The analog input signal at node 701 is selectively connected to the nodes 711, 713, 715, 717 by way of the switches 702, 704, 706, and 708, respectively. The residual voltage VR at node 703 is selectively connected to the nodes 711, 713, 715, 717 by the switches 712, 714, 722, and 724, respectively. The nodes 713, 715, and 717 are selectively connected to the predetermined high reference voltage source (VREFP) by the switches 732, 734, and 736, respectively. The nodes 713, 715, and 717 are selectively connected to the predetermined low reference voltage source (VREFM) by the switches 742, 744, and 746, respectively. The nodes 713, 715, and 717 are selectively connected to the predetermined zero voltage source by the switches 752, 754, and 756, respectively. The node 711 is selectively connected to the node 703 by the switch 762. The capacitor coupled to capacitor position 721 is coupled between the nodes 717 and 733. The capacitor coupled to capacitor position 723 is coupled between the nodes 715 and 733. The capacitor coupled to capacitor position 725 is coupled between the nodes 713 and 731. The capacitor coupled to capacitor position 727 is coupled between the nodes 711 and 731. Node 731 is selectively connected to the predetermined zero voltage by switch 790. Node 733 is selectively connected to the predetermined zero voltage by switch 792. Node 731 is selectively connected to node 733 by switch 782. Node 731 is selectively connected to the negative input terminal of the op-amp 755 by switch 764, while node 733 is selectively connected to the negative input terminal of the op-amp by the switch 774. Node 715 is selectively connected to the node 703 through switch 772. The negative input terminal of the op-amp 755 is selectively connected to the node 783 by the switch 786. The negative input terminal of the op-amp 755 is selectively connected to the node 703 by the switch 794. The positive input terminal of the op-amp 755 is connected to ground (e.g., $V_{AG}$). The capacitor 781 is selectively coupled between the node 703 and the node 783 by the switch 788. Node 783 is selectively coupled to the predetermined zero voltage by the switch 784.

In one embodiment, during a phase of a conversion cycle the MDAC 700 is operable to produce a first gain factor of four (4) for the analog input signal and a selected second gain factor of zero, one, two, or three (0, 1, 1, or 5) for a selected one of the reference voltages (VREFP, VREFM, or zero). According to the example embodiment, during subsequent phases of the conversion cycle the MDAC 700 is operable to produce a first gain factor of two (2) for the residual voltage VR and a selected second gain factor of zero or one (0 or 1) for a selected one of the reference voltages (VREFP, VREFM, or zero). It should be recalled that that the MDAC 700 illustrated in FIG. 7 is but one possible implementation for the programmable gain/summing element 525 of FIG. 5.

Switches 505 and 515 of FIG. 6, as well as the switches included in the MDAC 700 of FIG. 7, control the operation of the multi-bit/single-bit RSD stage 500. As will become apparent in the following paragraphs, some of the switches in the MDAC 700 are controlled using control signals (e.g., switch signals SW0-SWn, FIG. 3) derived from a common clock signal, while other switches are controlled by the high, low, and mid-switch control signals (h, l, m) that are generated by the logic circuit 520 of the sub-ADC 600. The details associated with deriving one or several control signals from a clock signal is not explained in further detail here, as they are not critical for an understanding of the example embodiments.

The switches that are included in the MDAC 700 of FIG. 7 are all listed in the left column of Table 1 below. Control signals are listed in the right column of Table 1. For each switch or group of switches appearing in the rows of the left column, the corresponding row in the right column contains the control signal or control signals that determine the state of the switch or group of switches. The (OR) notation for switches 790 and 792 refers to the logical OR function.

TABLE 1

| Switch(es) | Control Signal |
| --- | --- |
| 702, 704, 706, 708 | SWVIN |
| 712, 714 | SWFB1 |
| 722, 724 | SWFB2 |
| 732, 734, 736 | h (from logic circuit 520) |
| 742, 744, 746 | l (from logic circuit 520) |
| 772, 774, 776 | m (from logic circuit 520) |
| 762, 764 | MFB1 |
| 772, 774 | MFB2 |
| 782, 784 | $H_O$ |
| 786 | $H_E$ |
| 788 | $H_{SH}$ |
| 790 | SWVIN (OR) SWFB1 |
| 792 | SWVIN (OR) SWFB2 |
| 794 | reset |

Figure 8:
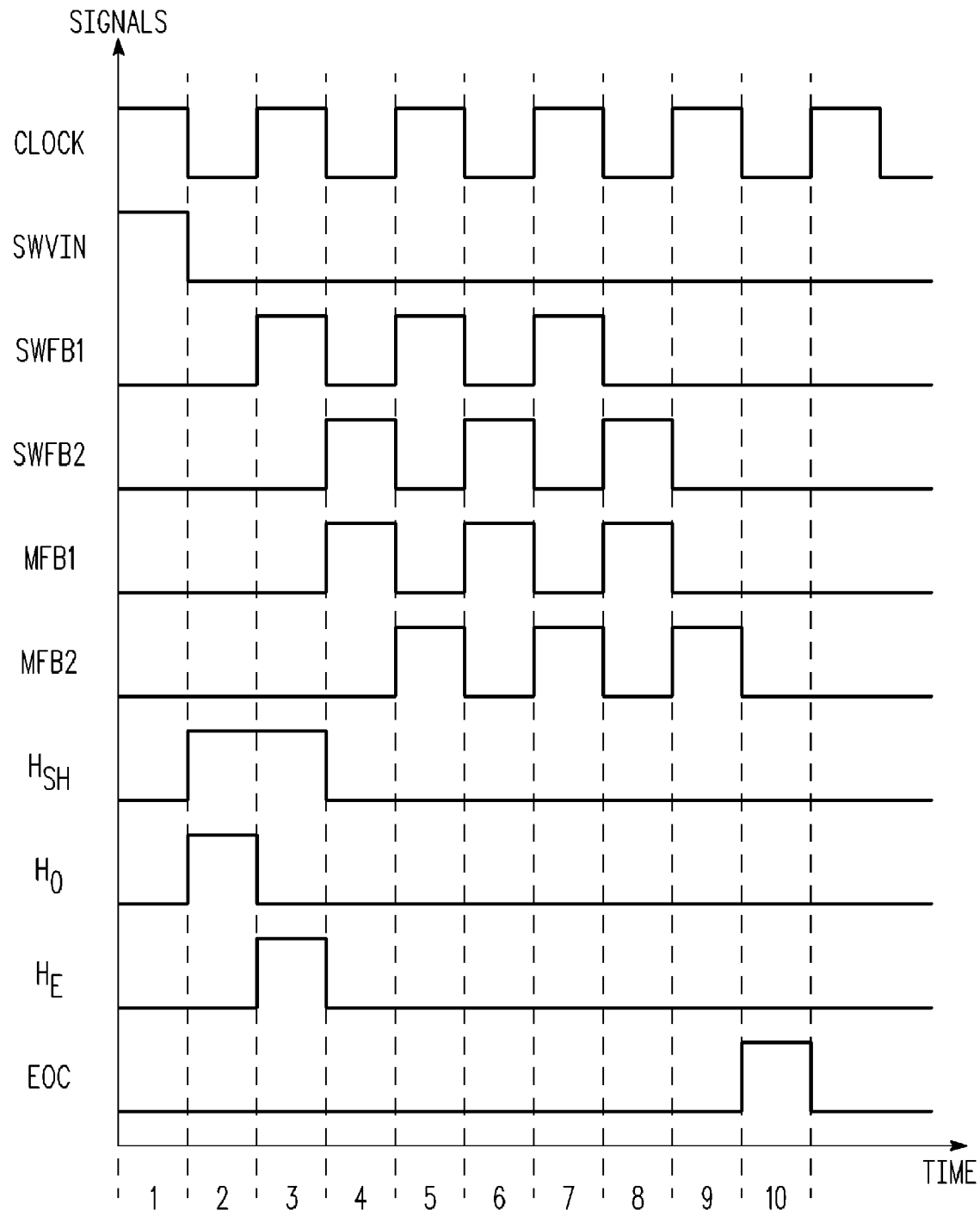
FIG. 8 is an example timing diagram illustrating control signals used to perform an example 10-bit analog-to-digital conversion cycle with the sub-ADC of FIG. 6 and the MDAC of FIG. 7 in accordance with at least one embodiment of the present disclosure.

FIG. 8 is an example timing diagram illustrating control signals that may be used to perform an example 10-bit conversion cycle using the sub-ADC 600 of FIG. 6 and the MDAC 700 of FIG. 7. FIG. 8 illustrates a clock signal, as well as control signals that were named in Table 1 that are derived from the clock signal. In FIG. 8, one clock cycle is defined as the time between adjacent rising edges of the clock signal. A clock phase is each "up" or "down" period of the clock signal. Thus, FIG. 8 illustrates control signals from Table 1 for ten sequential clock phases or five clock cycles. In this example, each clock phase corresponds to a phase of a ten-phase conversion cycle. As illustrated in FIG. 8, the EOC signal, which initiates the generation of a pseudo-random number (PRN) that is used to randomly assign capacitors to corresponding initial capacitor positions, can be asserted at the last phase of the prior conversion cycle (e.g., the assertion of the EOC signal at phase 10 initiates the capacitor assignment for the next conversion cycle). Although FIG. 8 depicts the EOC signal being asserted in the clock phase immediately preceding the first phase of the next conversion cycle for ease of illustration, it will be appreciated timing issues, such as propagation delay, logic gate delay, setup time and hold time requirements, typically would necessitate generation of the PRN more than one clock phase prior to the start of the conversion cycle so as to allow the system to configure the capacitor connections. For FIG. 8, it is assumed that the EOC signal for the illustrated conversion cycle was asserted prior to phase 1 so as to initiate the random capacitor assignment for the conversion cycle represented by phases 1-10.

Table 2 illustrates the state of all the switches that are controlled by the control signals of FIG. 8 during each of the ten clock phases illustrated in FIG. 8. In Table 2, an "X" indicates that the associated switch or switches are closed, while the absence of an entry indicates that the associated switch or switches are open. Table 2 is derived using Table 1 and FIG. 8. For example, according to Table 1, the state of switch 792 is controlled based upon the logical expression SWVIN OR SWFB2. FIG. 8 illustrates that the control signal SWVIN or the control signal SWFB2 is at a logic "high" state during the first, fourth, sixth, and eighth clock phases. Consequently, Table 2 illustrates that switch 792 is closed during the first, fourth, sixth, and eighth clock phases. The state of the other switches may be derived in the same manner. Table 2 therefore provides a convenient way to summarize the state of switches that are illustrated in FIG. 7 during the ten clock phases illustrated in FIG. 8.

TABLE 2

| Switch(es) | Clock Phase | | | | | | | | | |
|---|---|---|---|---|---|---|---|---|---|---|
| | 1 | 2 | 3 | 4 | 5 | 6 | 7 | 8 | 9 | 10 |
| 702, 704, 706, 708 | X | | | | | | | | | |
| 712, 714 | | | | X | | X | | X | | |
| 722, 724 | | | | | X | | X | | X | |
| 762, 764 | | | | | X | | X | | X | |
| 772, 774 | | | | | | X | | X | | X |
| 782, 784 | | X | | | | | | | | |
| 786 | | | | X | | | | | | |
| 788 | | | X | X | | | | | | |
| 790 | X | | X | | X | | X | | | |
| 792 | X | | | X | | X | | X | | |

FIGS. 9-17 are simplified circuit diagrams illustrating the configuration of the sub-ADC 600 of FIG. 6 and the MDAC 700 of FIG. 7 for the first nine clock phases of the example 10-bit conversion cycle using the control signals illustrated in FIG. 8. The simplified circuit diagrams of FIGS. 9-17 may be obtained using the status of the switches during each phase of the 10-bit conversion cycle as summarized in Table 2. Thus, FIG. 9 corresponds to the first clock phase, FIG. 10 corresponds to the second clock phase, FIG. 11 corresponds to the third clock phase, etc., up to FIG. 17, which corresponds to the ninth clock phase. A diagram corresponding to the tenth clock phase omitted because, as can be seen in Table 2, all switches are open resulting in an uninteresting configuration for MDAC 700. In order to increase clarity, none of the switches illustrated in FIG. 7 are shown in the simplified circuit diagrams of FIGS. 9-17, and any of the capacitor positions 721, 723, 725, or 727 that is grounded on both sides during a particular clock phase is not illustrated in the Figure corresponding to that clock phase.

Figure 9:
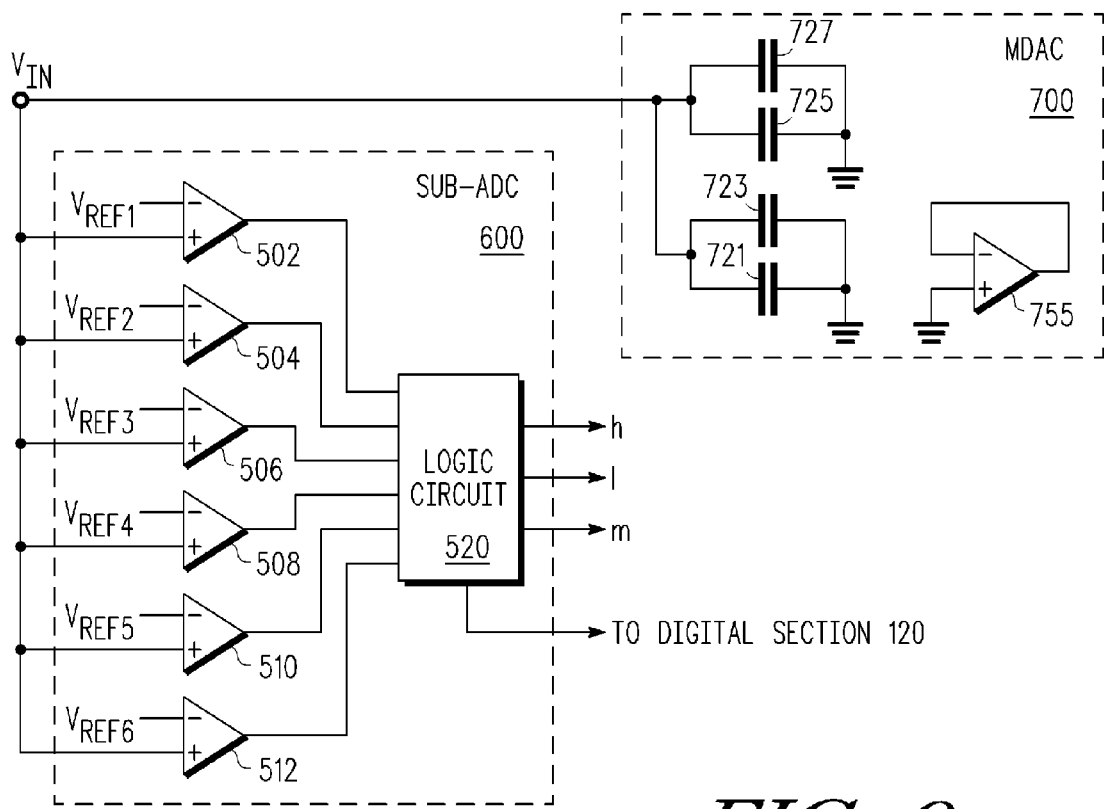
FIG. 9 is a simplified circuit diagram illustrating the configuration of the sub-ADC of FIG. 6 and the MDAC of FIG. 7 during the first clock phase of the example analog-to-digital conversion cycle of FIG. 8 in accordance with at least one embodiment of the present disclosure.

FIG. 9 is a simplified circuit diagram illustrating the configuration of the sub-ADC 600 and the MDAC 700 during the first phase of the example 10-bit conversion cycle. Prior to the first phase, the EOC signal is asserted, resulting in the generation of a PRN by the PRNG 116 (FIG. 1). Based on the PRN, the position switch network 304 (FIG. 3) randomly couples each of the capacitors 311-314 (FIG. 3) to a corresponding output lead pair of the position switch network 304. Each output lead pair of the position switch network 304 is coupled to a corresponding one of the capacitor positions 721, 723, 725, and 727 (corresponding to capacitor positions 241, 242, 243, and 244, respectively, of capacitor configurations 201 and 202 of FIG. 2).

During the first phase, the analog input is sampled by the MDAC 700 and the sub-ADC 600, which uses outputs from all of the comparators 502, 504, 506, 508, 510, and 512 to generate three bits of raw digital data that are sent to the digital section 120 of FIG. 1. During the first phase, the reset signal is asserted to close the switch 794 of FIG. 7, which results in the resetting of op-amp 755. According to other embodiments, the op-amp 755 may be reset during the first phase for any n-bit conversion cycle.

Figure 10:
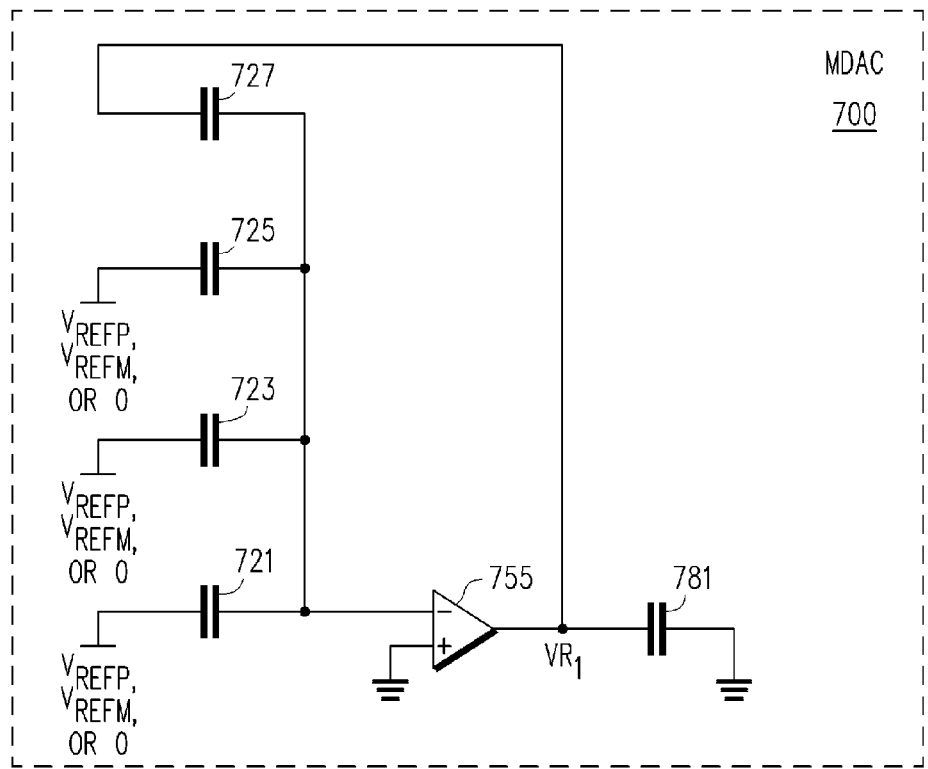
FIG. 10 is a simplified circuit diagram illustrating the configuration of the sub-ADC of FIG. 6 and the MDAC of FIG. 7 during the second clock phase of the example analog-to-digital conversion cycle of FIG. 8 in accordance with at least one embodiment of the present disclosure.

FIG. 10 is a simplified circuit diagram illustrating the configuration of the sub-ADC 600 and the MDAC 700 during the second phase of the example 10-bit conversion cycle. During the second phase, the op-amp 755 generates the residual voltage VR1 based upon the full sub-ADC 600 results from the previous first phase. As was explained above, VR1 is generated using four as the first gain factor for the analog input signal and using two as the second gain factor for a selected one of the predetermined reference voltage sources (VREFP, VREFM, zero). The capacitors in the capacitor positions 721, 723, and 725 are connected to either the predetermined high reference voltage source (VREFP), the predetermined low reference voltage source (VREFM), or the predetermined zero reference voltage based upon the high, low, and the mid switch control signals (h, l, m). As was explained above, the high, low, and mid switch control signals h, l, m determine the state of the switches 732, 734, 736, 742, 744, 746, 752, 754, 756 (FIG. 7) of the MDAC 700. During the second phase, the residual voltage VR1 is sampled on to the capacitor 781. Note that during the second phase, the sub-ADC 600 does not generate a digital output signal of one or more raw digital bits. According to other embodiments, the sub-ADC 600 does not generate a digital output signal during the second phase for any n-bit conversion cycle.

Figure 11:
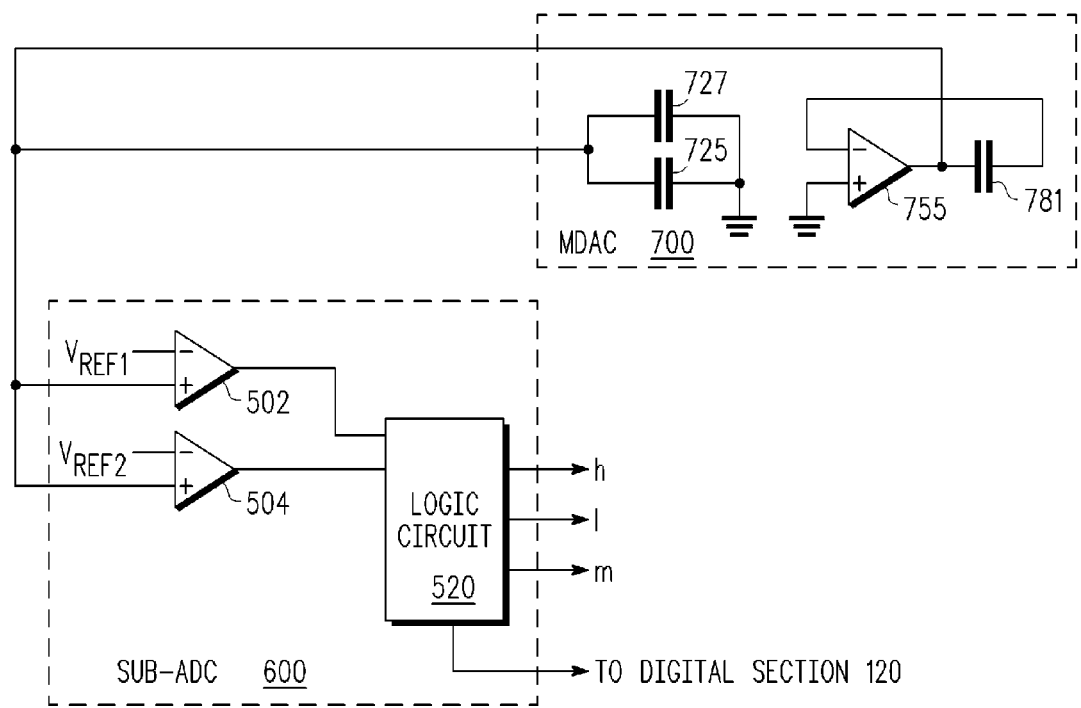
FIG. 11 is a simplified circuit diagram illustrating the configuration of the sub-ADC of FIG. 6 and the MDAC of FIG. 7 during the third clock phase of the example analog-to-digital conversion cycle of FIG. 8 in accordance with at least one embodiment of the present disclosure.

FIG. 11 is a simplified circuit diagram illustrating the configuration of the sub-ADC 600 and the MDAC 700 during the third phase of the example 10-bit conversion cycle. During the third phase, the residual voltage VR1 generated during the previous second phase is held and sampled on to the capacitors in the capacitor positions 725 and 727 as well as sampled by the comparators 502 and 504 of the sub-ADC 600. During the third phase, the first predetermined voltage signal (VREF1) may be a predetermined high voltage (VH) that is applied to the negative input terminal of the first comparator 502. During the third phase, the second predetermined voltage signal (VREF2) may be a predetermined low voltage (VL) that is applied to the negative input terminal of the second comparator 504. The actual voltage values for VH and VL are a function of process technology since that may limit power supply voltages. However, in one example embodiment, VH is about 1.5 Volts (V) and more preferably about 1.475 V, while VL is about 1.2 V and more preferably about 1.225 V.

Based upon the output signals from the comparators 502, 504, the logic circuit 520 of the sub-ADC 600 may generate new values for the high, low, and mid switch control signals (h, l, m). The sub-ADC 600 also generates two raw digital bits at the end of the third phase, which are sent to the digital section 120 of FIG. 1. It will be appreciated by those of ordinary skill that the resolution achieved by the single-bit/multi-bit stage 500 during this phase is only 1.5 bits, since only two comparators 502, 504 of the sub-ADC 600 are used.

Figure 12:
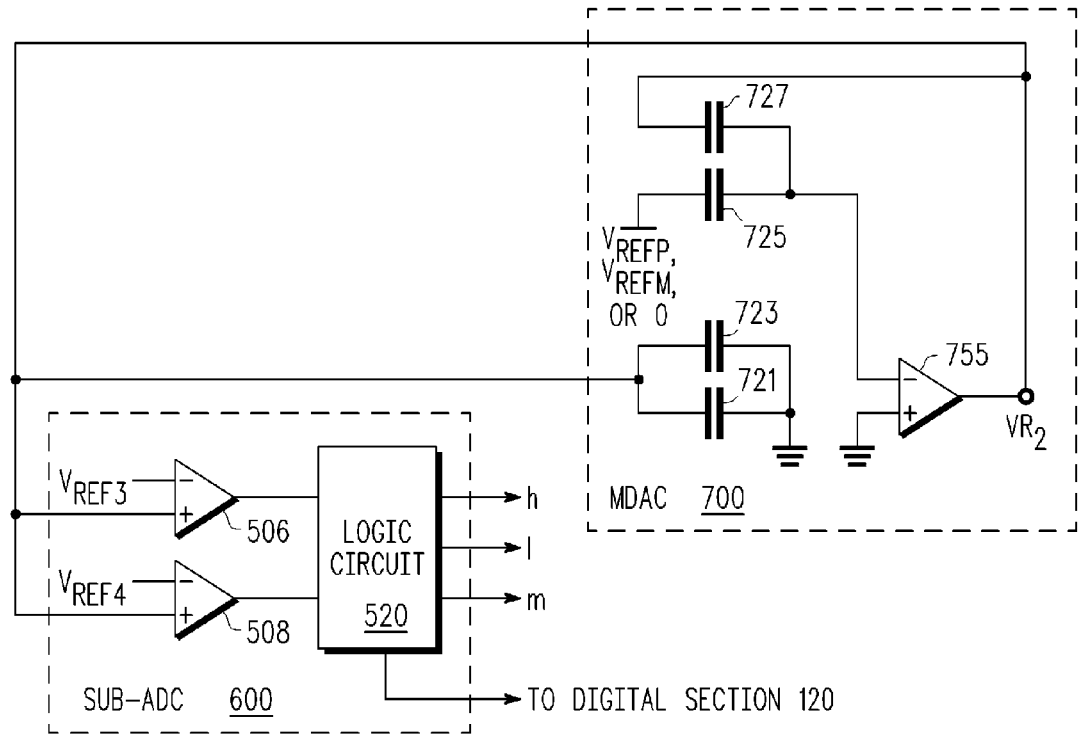
FIG. 12 is a simplified circuit diagram illustrating the configuration of the sub-ADC of FIG. 6 and the MDAC of FIG. 7 during the fourth clock phase of the example analog-to-digital conversion cycle of FIG. 8 in accordance with at least one embodiment of the present disclosure.

FIG. 12 is a simplified circuit diagram illustrating the configuration of the sub-ADC 600 and the MDAC 700 during the fourth phase of the example 10-bit conversion cycle. During the fourth phase, the op-amp 755 generates a new residual voltage VR2 from the previous residual voltage VR1 based on the control signals (h, l, m) from the previous third phase. The residual voltage VR2 is held and sampled on to the capacitors in the capacitor positions 721 and 723 as well as sampled by the comparators 506, 508 of the sub-ADC 600. During the fourth phase, the third predetermined voltage signal (VREF3) may be the predetermined high voltage (VH) that is applied to the negative input terminal of the third comparator 506. During the fourth phase, the fourth predetermined voltage signal (VREF4) may be the predetermined low voltage (VL) that is applied to the negative input terminal of the fourth comparator 508. Based upon the output signals from the comparators 506, 508, the sub-ADC 600 may generate new values for the high, low, and mid-switch control signals (h, l, and m). The sub-ADC 600 also generates two raw digital bits at the end of the fourth phase, which are sent to the digital section 120 of FIG. 1.

Figure 13:
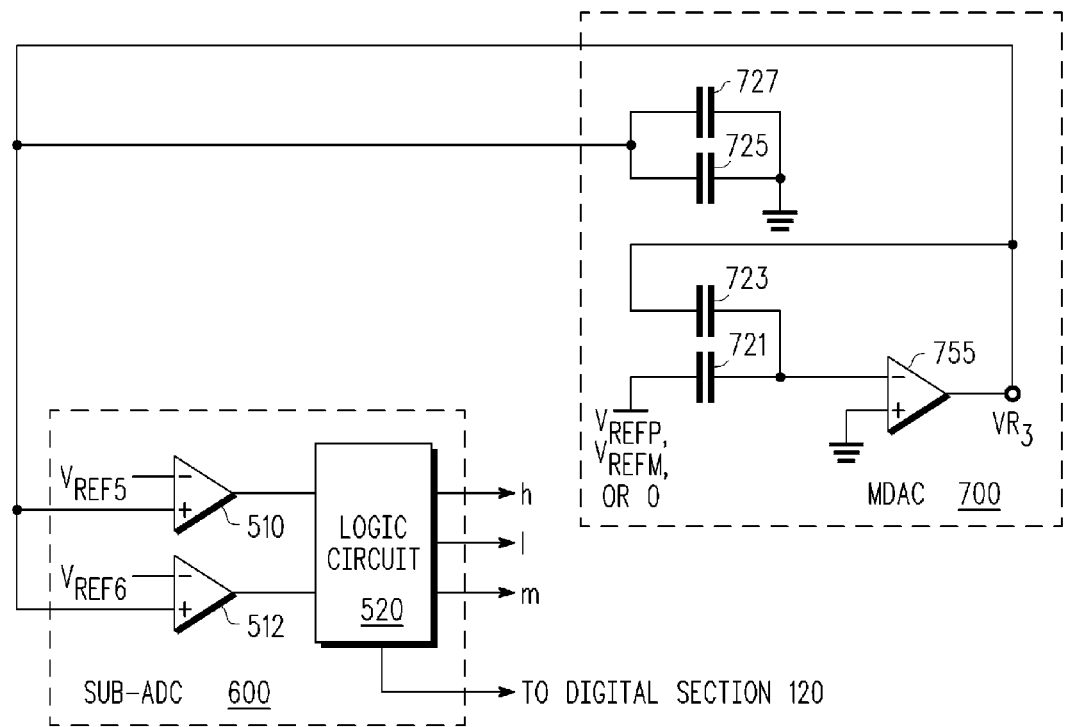
FIG. 13 is a simplified circuit diagram illustrating the configuration of the sub-ADC of FIG. 6 and the MDAC of FIG. 7 during the fifth clock phase of the example analog-to-digital conversion cycle of FIG. 8 in accordance with at least one embodiment of the present disclosure.
Figure 14:
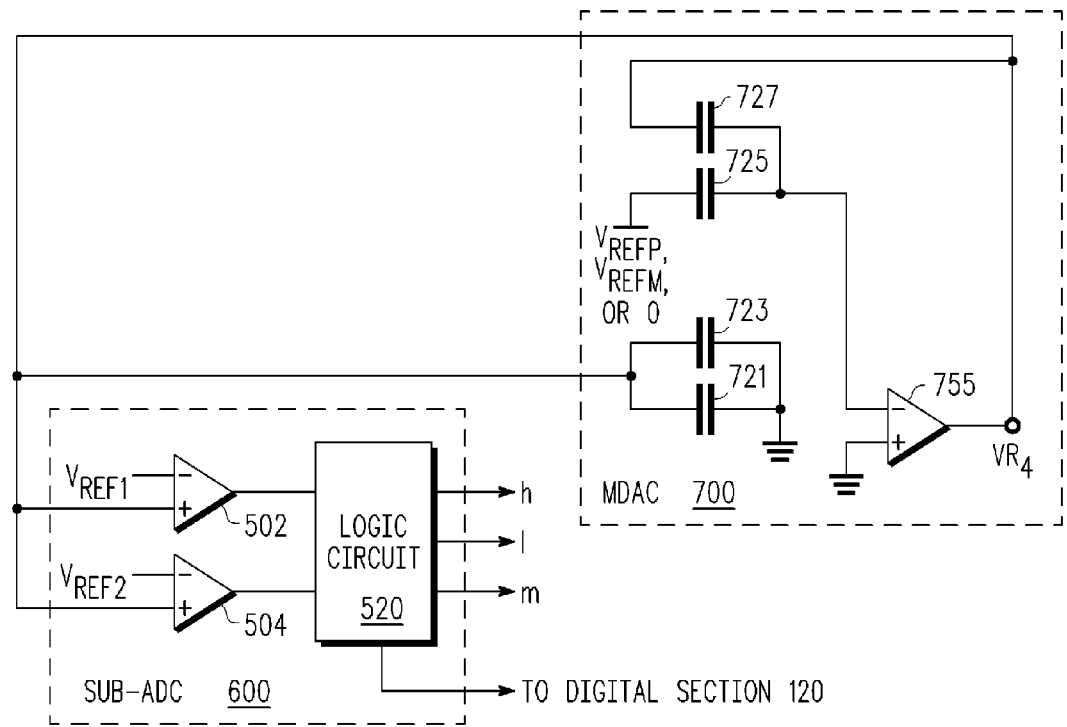
FIG. 14 is a simplified circuit diagram illustrating the configuration of the sub-ADC of FIG. 6 and the MDAC of FIG. 7 during the sixth clock phase of the example analog-to-digital conversion cycle of FIG. 8 in accordance with at least one embodiment of the present disclosure.

FIG. 13 is a simplified circuit diagram illustrating the configuration of the sub-ADC 600 and the MDAC 700 during the fifth phase of the example 10-bit conversion cycle. During the fifth phase, the op-amp 755 generates a new residual voltage VR3 from the previous residual voltage VR2 based on the control signals (h, l, m) from the previous fourth phase. The residual voltage VR3 is held and sampled on to the capacitors in the capacitor positions 725 and 727 as well as sampled by the comparators 510, 512 of the sub-ADC 600. During the fifth phase, the fifth predetermined voltage signal (VREF5) may be the predetermined high voltage (VH) that is applied to the negative input terminal of the fifth comparator 510. During the fifth phase, the sixth predetermined voltage signal (VREF6) may be the predetermined low voltage (VL) that is applied to the negative input terminal of the sixth comparator 512. Based upon the output signals from the comparators 510, 512, the sub-ADC 600 may generate new values for the high, low, and mid-switch control signals h, l, and m. The sub-ADC 600 also generates two raw digital bits at the end of the fifth phase, which are sent to the digital section 120 of FIG. 1.

FIG. 13 is a simplified circuit diagram illustrating the configuration of the sub-ADC 600 and the MDAC 700 during the sixth phase of the example 10-bit conversion cycle. During the sixth phase, the op-amp 755 generates a new residual voltage VR4 from the previous residual voltage VR3 based on the control signals (h, l, m) from the previous fifth phase. The residual voltage VR4 is held and sampled on to the capacitors in the capacitor positions 721 and 723 as well as sampled by the comparators 502, 504 of the sub-ADC 600. During the sixth phase, the first predetermined voltage signal (VREF1) may be the predetermined high voltage (VH) that is applied to the negative input terminal of the first comparator 502. During the sixth phase, the second predetermined voltage signal (VREF2) may be the predetermined low voltage (VL) that is applied to the negative input terminal of the sixth comparator 504. Based upon the output signals from the comparators 502, 504 the sub-ADC 600 may generate new values for the high, low, and mid-switch control signals (h, l, and m). The sub-ADC 600 also generates two raw digital bits at the end of the sixth phase, which are sent to the digital section 120 of FIG. 1.

Figure 15:
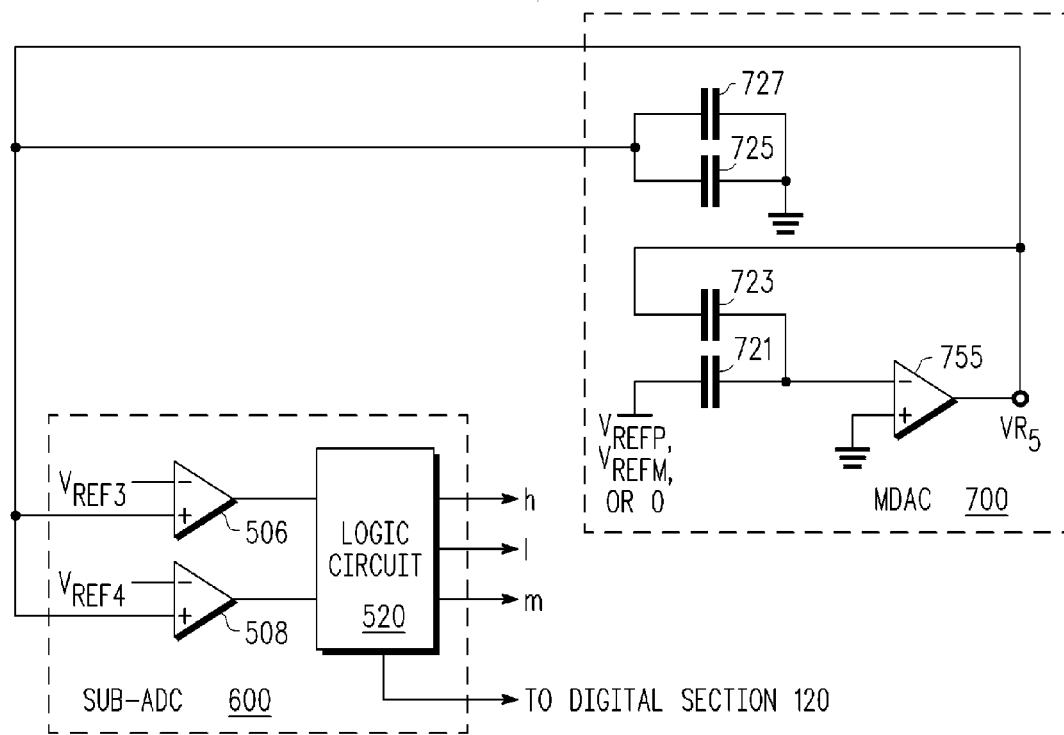
FIG. 15 is a simplified circuit diagram illustrating the configuration of the sub-ADC of FIG. 6 and the MDAC of FIG. 7 during the seventh clock phase of the example analog-to-digital conversion cycle of FIG. 8 in accordance with at least one embodiment of the present disclosure.

FIG. 15 is a simplified circuit diagram illustrating the configuration of the sub-ADC 600 and the MDAC 700 during the seventh phase of the example 10-bit conversion cycle. During the seventh phase, the op-amp 755 generates a new residual voltage VR5 from the previous residual voltage VR4 based on the control signals (h, l, m) from the previous sixth phase. The residual voltage VR5 is held and sampled on to the capacitors in the capacitor positions 725 and 727 as well as sampled by the comparators 506, 508 of the sub-ADC 600. During the seventh phase, the third predetermined voltage signal (VREF3) may be the predetermined high voltage (VH) that is applied to the negative input terminal of the third comparator 506. During the seventh phase, the fourth predetermined voltage signal (VREF4) may be the predetermined low voltage (VL) that is applied to the negative input terminal of the fourth comparator 508. Based upon the output signals from the comparators 506, 508 the sub-ADC 600 may generate new values for the high, low, and mid-switch control signals (h, l, and m). The sub-ADC 600 also generates two raw digital bits at the end of the seventh phase, which are sent to the digital section 120 of FIG. 1.

Figure 16:
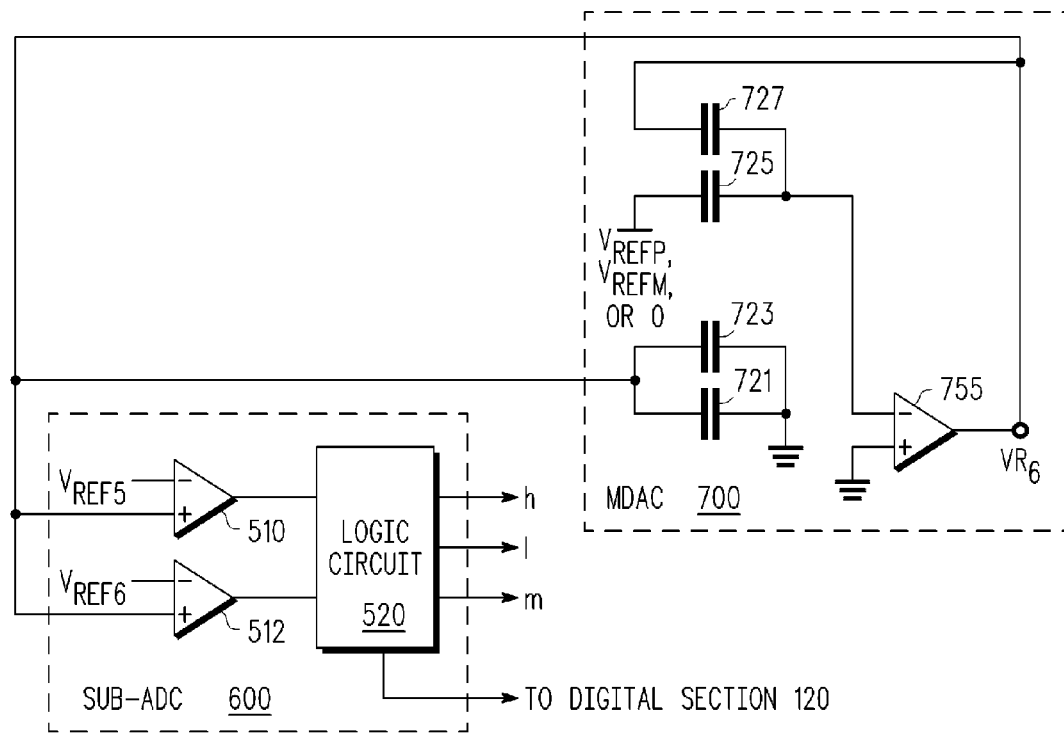
FIG. 16 is a simplified circuit diagram illustrating the configuration of the sub-ADC of FIG. 6 and the MDAC of FIG. 7 during the eighth clock phase of the example analog-to-digital conversion cycle of FIG. 8 in accordance with at least one embodiment of the present disclosure.

FIG. 16 is a simplified circuit diagram illustrating the configuration of the sub-ADC 600 and the MDAC 700 during the eighth phase of the example 10-bit conversion cycle. During the eighth phase, the op-amp 755 generates a new residual voltage VR6 from the previous residual voltage VR5 based on the control signals (h, l, m) from the previous seventh phase. The residual voltage VR6 is held and sampled on to the capacitors in the capacitor positions 721 and 723 as well as sampled by the comparators 510, 512 of the sub-ADC 600. During the eighth phase, the fifth predetermined voltage signal (VREF5) may be the predetermined high voltage (VH) that is applied to the negative input terminal of the fifth comparator 510. During the eighth phase, the sixth predetermined voltage signal (VREF6) may be the predetermined low voltage (VL) that is applied to the negative input terminal of the sixth comparator 512. Based upon the output signals from the comparators 510, 512 the sub-ADC 600 may generate new values for the high, low, and mid-switch control signals (h, l, and m). The sub-ADC 600 also generates two raw digital bits at the end of the eighth phase, which are sent to the digital section 120 of FIG. 1.

Figure 17:
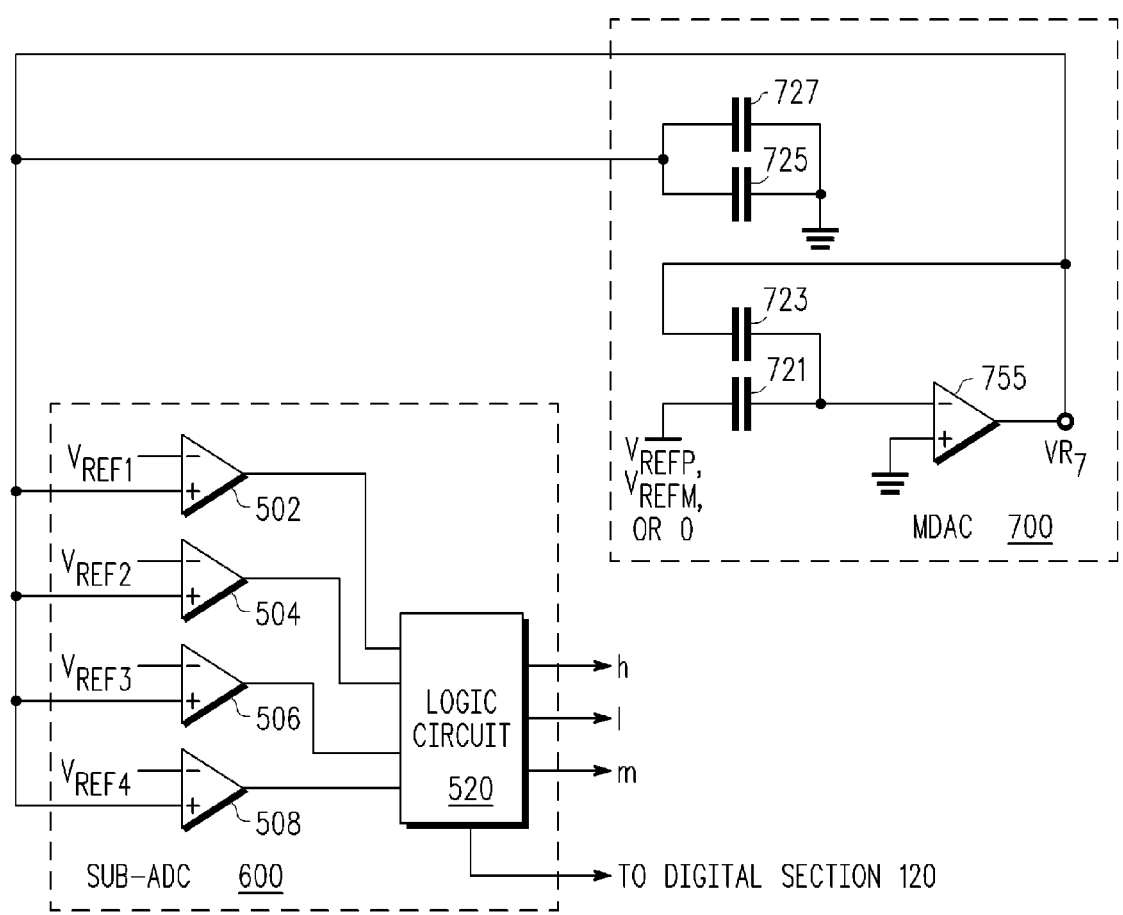
FIG. 17 is a simplified circuit diagram illustrating the configuration of the sub-ADC of FIG. 6 and the MDAC of FIG. 7 during the ninth clock phase of the example analog-to-digital conversion cycle of FIG. 8 in accordance with at least one embodiment of the present disclosure.

FIG. 17 is a simplified circuit diagram illustrating the configuration of the sub-ADC 600 and the MDAC 700 during the ninth phase of the example 10-bit conversion cycle. During the ninth phase, the op-amp 755 generates a new residual voltage VR7 from the previous residual voltage VR6 based on the control signals (h, l, m) from the previous eighth phase. The residual voltage VR7 is held and sampled on to the capacitors in the capacitor positions 727 and 725 as well as sampled by the comparators 502, 504, 506, 508 of the sub-ADC 600. During the ninth phase, the first and third predetermined voltage signals (VREF1, VREF3) may be the predetermined high voltage (VH) that is applied to the negative input terminals of the first and third comparators 502, 506. During the ninth phase, the second and fourth predetermined voltage signals (VREF2, VREF4) may be the predetermined low voltage (VL) that is applied to the negative input terminals of the second and fourth comparators 504, 508. Based upon the output signals from the comparators 502, 504, 506, 508 the sub-ADC 600 may generate new values for the high, low, and mid-switch control signals (h, l, and m). The sub- ADC 600 also generates two raw digital bits at the end of the ninth phase, which are sent to the digital section 120 of FIG. 1.

As explained above, the raw digital bits obtained from the sub-ADC 600 in the example 10-bit conversion cycle were sent to the digital section 120 of FIG. 1 during the first phase and during the third through ninth phases. In particular, the raw digital bits are sent to the alignment and synchronization block 130 of FIG. 1, where they are aligned and synchronized. During the tenth phase of the example 10-bit conversion cycle, a digital correction is performed in the correction block 140 to produce a 10-bit binary word at the end of the tenth phase, completing the example 10-bit conversion cycle. The process may then be repeated in the manner described above to produce a second 10-bit binary word. The number of raw digital bits obtained from the sub-ADC 600 in the example 10-bit conversion cycle described above was actually greater than 10 bits. This discrepancy is accounted for because in each one of the phases that results in raw digital bits being output from the sub-ADC 600, one of the raw bits is redundant and is discarded during further processing in the digital section 120. Thus, three raw digital bits from the sub-ADC during one phase produced two bits for the 10-bit conversion cycle, and two raw digital bits from the sub-ADC during one phase produced one bit of the 10-bit conversion cycle.

According to the example 10-bit conversion cycle described above, five clock cycles are needed to produce a 10-bit binary word. Thus, generalizing to any n-bit conversion cycle where n is even, an n-bit binary word may be produced in n/2 clock cycles. In alternative embodiments, the sub-ADC 600 and the MDAC 700 could be configured to produce two raw digital bits during, for example, the ninth phase that was described above as producing three raw digital bits for the example 10-bit conversion cycle. Thus, generalizing to any n-bit conversion cycle where n is odd, an n-bit binary word may be produced in (n+1)/2 clock cycles. The number of clock cycles used in the example 10-bit conversion described above is not significantly different from the number of clock cycles required by the single multi-bit ADC described in U.S. Pat. No. 6,535,157, which may produce two digital bits during one phase of every clock cycle. However, those skilled in the art will appreciate that because the sub-ADC 600 and the MDAC 700 of the example embodiment can be continually reconfigured to produce two raw digital bits during every phase for a clock cycle after an initial clock cycle, the example embodiment can achieve the same performance with reduced thermal noise, area, and power.

For example, in the 10-bit conversion described above, the first phase of the first clock cycle and the ninth phase of the fifth clock cycle were used to produce three raw digital bits from the sub-ADC 600. The sub-ADC 600 was not used during the second phase of the first clock cycle. In the second through fourth clock cycles, however, by efficiently reconfiguring circuitry in the MDAC 700 during each phase to perform a different function, the sub-ADC 600 was used during each phase to produce two raw digital bits in each phase. Thus, according to example embodiments a single RSD conversion cycle stage can be initially configured to output at least three raw bits during an initial conversion clock cycle, then be subsequently reconfigured to output two raw bits during every phase of subsequent conversion clock cycles in order to determine the remaining bits of the conversion cycle with reduced capacitance, reduced area, and reduced power requirements.

In accordance with one aspect of the present disclosure, a method is provided in the context of an analog-to-digital converter (ADC) comprising a multiplying digital-to-analog converter (MDAC) having a plurality of capacitor positions. The method includes generating a random number for a conversion cycle. The method further includes configuring each capacitor of the plurality of capacitors in a corresponding capacitor position of the plurality of capacitor positions based on the random number for the conversion cycle. The method additionally includes converting, for the conversion cycle, a voltage of an analog signal to a digital value using the ADC.

In accordance with another aspect of the present disclosure, an analog-to-digital converter (ADC) is provided. The ADC comprises a random number generator to generate a random number and a multiplying digital-to-analog converter (MDAC). The MDA comprises an amplifier and a plurality of capacitor positions, each selectively coupleable to the amplifier in a corresponding sequence of sample and gain configurations for a corresponding sequence of phases of a conversion cycle. The MDAC further comprises a plurality of capacitors and a switch network configured to selectively configure each capacitor of the plurality of capacitors in a corresponding capacitor position of the plurality of capacitor position based on the random number.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
    providing an analog-to-digital converter (ADC) comprising a multiplying digital-to-analog converter (MDAC) having a plurality of capacitor positions;
    generating a first random number for a first conversion cycle;
    configuring each capacitor of the plurality of capacitors in a corresponding capacitor position of the plurality of capacitor positions based on the first random number for the first conversion cycle; and
    converting, for the first conversion cycle, a first voltage of an analog signal to a first digital value using the ADC.

2. The method of claim 1, further comprising:
    generating a second random number for a second conversion cycle;
    configuring each capacitor of the plurality of capacitors in a corresponding capacitor position of the plurality of capacitor positions based on the second random number for the second conversion cycle; and
    converting, for the second conversion cycle, a second voltage of the analog signal to a second digital value using the ADC.

3. The method of claim 1, wherein generating the first random number comprises generating a pseudo-random number.

4. The method of claim 1, wherein the ADC comprises a redundant signed digit (RSD) stage comprising the MDAC.

5. The method of claim 1, wherein:
    the MDAC comprises an amplifier, a first capacitor position, a second capacitor position, a third capacitor position, and a fourth capacitor position; and converting the first voltage to the first digital value comprises:
  during a first phase of the first conversion cycle:
    coupling a capacitor configured in the first capacitor position to a first sample configuration, the first sample configuration comprising a first capacitor electrode coupled to the input analog signal and a second capacitor electrode coupled to a first voltage reference;
    coupling a capacitor configured in the second capacitor position to the first sample configuration;
    coupling a capacitor configured in the third capacitor position to the first sample configuration; and
    coupling a capacitor configured in the fourth capacitor position to the first sample configuration.

6. The method of claim 5, wherein converting the first voltage to the first digital value further comprises:
  during a second phase of the first conversion cycle following the first phase:
    coupling the capacitor configured in the first capacitor position to a first gain configuration, the first gain configuration comprising the first capacitor electrode coupled to a second voltage reference and the second capacitor electrode coupled to an input of the amplifier;
    coupling the capacitor configured in the second capacitor position to the first gain configuration;
    coupling the capacitor configured in the third capacitor position to the first gain configuration; and
    coupling the capacitor configured in the fourth capacitor position to a second gain configuration, the second gain configuration comprising the first capacitor electrode coupled to an output of the amplifier and the second capacitor electrode coupled to the input of the amplifier.

7. The method of claim 6, wherein converting the first voltage to the first digital value further comprises:
  during a third phase of the first conversion cycle following the second phase:
    coupling the capacitor configured in the third capacitor position to a second sample configuration, the second sample configuration comprising the first capacitor electrode coupled to the output of the amplifier and the second capacitor electrode coupled to the first voltage reference; and
    coupling the capacitor configured in the fourth capacitor position to the second sample configuration; and
  during a fourth phase of the first conversion cycle following the third phase:
    coupling the capacitor configured in the third capacitor position to the first gain configuration;
    coupling the capacitor configured in the fourth capacitor position to the second gain configuration;
    coupling the capacitor configured in the first capacitor position to the second sample configuration; and
    coupling the capacitor configured in the second capacitor position to the second sample configuration.

8. An analog-to-digital converter (ADC) comprising:
  a random number generator to generate a random number; and
  a multiplying digital-to-analog converter (MDAC) comprising:
    an amplifier;
    a plurality of capacitor positions, each selectively coupleable to the amplifier in a corresponding sequence of sample and gain configurations for a corresponding sequence of phases of a conversion cycle;
    a plurality of capacitors; and
    a first switch network configured to selectively configure each capacitor of the plurality of capacitors in a corresponding capacitor position of the plurality of capacitor positions based on the random number.

9. The ADC of claim 8, further comprising:
  a second switch network configured to selectively couple each capacitor coupled to a corresponding capacitor position in the corresponding sequence of sample and gain configurations during the conversion cycle.

10. The ADC of claim 9, wherein:
  the plurality of capacitor configurations comprises a first capacitor position, a second capacitor position, a third capacitor position, and a fourth capacitor position; and
  the second switch network is configured to:
    couple a capacitor configured in the first capacitor position to a first sample configuration during a first phase of the conversion cycle, the first sample configuration comprising a first capacitor electrode coupled to a select one of an output of the amplifier or a first voltage reference and a second capacitor electrode coupled to a first voltage reference;
    couple a capacitor configured in the second capacitor position to the first sample configuration during the first phase;
    couple a capacitor configured in the third capacitor position to the first sample configuration during the first phase; and
    couple a capacitor configured in the fourth capacitor position to the first sample configuration during the first phase.

11. The ADC of claim 10, wherein the second switch network further is configured to:
  couple the capacitor configured in the first capacitor position to a first gain configuration during a second phase of the conversion cycle following the first phase, the first gain configuration comprising the first capacitor electrode coupled to a second voltage reference and the second capacitor electrode coupled to an input of the amplifier;
  couple the capacitor configured in the second capacitor position to the first gain configuration during the second phase;
  couple the capacitor configured in the third capacitor position to the first gain configuration during the second phase; and
  couple the capacitor configured in the fourth capacitor position to a second gain configuration during the second phase, the second gain configuration comprising the first capacitor electrode coupled to an output of the amplifier and the second capacitor electrode coupled to the input of the amplifier.

12. The ADC of claim 8, wherein:
  the random number generator is configured to generate a random number for each conversion cycle of a plurality of conversion cycles; and
  the first switch network is configured to selectively couple each capacitor of the plurality of capacitors to a corresponding capacitor position of the plurality of capacitor position for each conversion cycle of the plurality of conversion cycles based on the random number generated for the corresponding conversion cycle.

13. The ADC of claim 8, further comprising a redundant signed digit (RSD) stage comprising the MDAC.

14. The ADC of claim 13, further comprising:
  an analog input terminal configured to receive an analog input signal;

the RSD stage configured to:
- produce a first number of bits at a digital output from the analog input signal during a first phase of the conversion cycle;
- provide a residual voltage of the analog input signal at the analog input terminal during a second phase of the conversion cycle; and
- provide a second number of bits from the residual voltage during third phase of the conversion cycle, the second number of bits less than the first number of bits; and a digital section configured to perform a digital alignment and correction on the first number of bits and the second number of bits to generate a digital value.

15. The ADC of claim 8, wherein the random number generator comprises a pseudo-random number generator.

16. An analog-to-digital converter (ADC) comprising:
- a multiplying digital-to-analog converter (MDAC) having a plurality of capacitor positions;
- a random number generator configured to generate a first random number for a first conversion cycle;
- means for coupling each capacitor of the plurality of capacitors in a corresponding capacitor position of the plurality of capacitor positions based on the first random number for the first conversion cycle; and
- means for converting, for the first conversion cycle, a first voltage of an analog signal to a first digital value using the MDAC.

17. The ADC of claim 16, wherein:
- the random number generator is further configured to generate a second random number for a second conversion cycle;
- the means for coupling comprises means for coupling each capacitor of the plurality of capacitors to a corresponding capacitor position of the plurality of capacitor positions based on the second random number for the second conversion cycle; and
- the means for converting comprises means for converting, for the second conversion cycle, a second voltage of the analog signal to a second digital value using the ADC.

18. The ADC of claim 16, wherein the random number generator comprises a pseudo-random number generator.

19. The ADC of claim 16, wherein the ADC comprises a redundant signed digit (RSD) stage comprising the MDAC.

20. The ADC of claim 19, wherein the RSD stage comprises a multiple-stage RSD.

* * * * *